US011171282B2

(12) United States Patent
Tanimoto et al.

(10) Patent No.: US 11,171,282 B2
(45) Date of Patent: Nov. 9, 2021

(54) ELONGATED PLATE-FORM PIEZOELECTRIC BODY AND PRODUCTION METHOD THEREFOR, LAYERED BODY AND PRODUCTION METHOD THEREFOR, FABRIC, GARMENT, AND BIOLOGICAL INFORMATION ACQUISITION DEVICE

(71) Applicant: MITSUI CHEMICALS, INC., Tokyo (JP)

(72) Inventors: Kazuhiro Tanimoto, Nagoya (JP); Katsuki Onishi, Nagoya (JP); Yuzo Nakamura, Ichihara (JP)

(*) Notice: Subject to any disclaimer, the term of this patent is extended or adjusted under 35 U.S.C. 154(b) by 753 days.

(21) Appl. No.: 15/763,801

(22) PCT Filed: Sep. 5, 2016

(86) PCT No.: PCT/JP2016/076022
§ 371 (c)(1),
(2) Date: Mar. 27, 2018

(87) PCT Pub. No.: WO2017/061209
PCT Pub. Date: Apr. 13, 2017

(65) Prior Publication Data
US 2018/0315917 A1    Nov. 1, 2018

(30) Foreign Application Priority Data

Apr. 21, 2016    (JP) .............................. JP2016-085422

(51) Int. Cl.
*H01L 41/193*    (2006.01)
*H01L 41/45*    (2013.01)
(Continued)

(52) U.S. Cl.
CPC ............ *H01L 41/193* (2013.01); *A41D 31/00* (2013.01); *B32B 7/02* (2013.01); *B32B 27/00* (2013.01);
(Continued)

(58) Field of Classification Search
CPC combination set(s) only.
See application file for complete search history.

(56) References Cited

U.S. PATENT DOCUMENTS

2009/0239433 A1    9/2009 Kurihara et al.
2012/0025674 A1    2/2012 Yoshida et al.
(Continued)

FOREIGN PATENT DOCUMENTS

JP    4922482 B2    4/2012
JP    4934235 B2    5/2012
(Continued)

OTHER PUBLICATIONS

English Translation of JP 2014093487 Tanimoto.*
(Continued)

*Primary Examiner* — Bryan P Gordon
(74) *Attorney, Agent, or Firm* — Buchanan Ingersoll & Rooney PC

(57) ABSTRACT

Provided is: an elongated plate-form piezoelectric body, which contains an optically active helical chiral polymer (A) having a weight-average molecular weight of from 50,000 to 1,000,000 and has an elongated plate shape having a thickness of from 0.001 mm to 0.2 mm, a width of from 0.1 mm to 30 mm and a width-to-thickness ratio of 2 or higher, and in which the lengthwise direction and the main orientation direction of the helical chiral polymer (A) are substantially parallel to each other; the crystallinity measured by a DSC method is from 20% to 80%; and the birefringence is from 0.01 to 0.03.

24 Claims, 14 Drawing Sheets

(51) Int. Cl.
| | |
|---|---|
| *H01L 41/113* | (2006.01) |
| *H01L 41/09* | (2006.01) |
| *B32B 27/36* | (2006.01) |
| *D03D 1/00* | (2006.01) |
| *B32B 27/00* | (2006.01) |
| *H01L 41/338* | (2013.01) |
| *B32B 7/02* | (2019.01) |
| *D03D 15/593* | (2021.01) |
| *A41D 31/00* | (2019.01) |
| *C08J 5/18* | (2006.01) |
| *H01L 41/047* | (2006.01) |
| *H01L 41/053* | (2006.01) |
| *H01L 41/08* | (2006.01) |

(52) U.S. Cl.
CPC ............ *B32B 27/36* (2013.01); *C08J 5/18* (2013.01); *D03D 1/00* (2013.01); *D03D 1/0088* (2013.01); *D03D 15/593* (2021.01); *H01L 41/047* (2013.01); *H01L 41/0533* (2013.01); *H01L 41/082* (2013.01); *H01L 41/0825* (2013.01); *H01L 41/09* (2013.01); *H01L 41/113* (2013.01); *H01L 41/338* (2013.01); *H01L 41/45* (2013.01); *C08J 2367/04* (2013.01)

(56) References Cited

U.S. PATENT DOCUMENTS

| | | | |
|---|---|---|---|
| 2012/0132846 | A1 | 5/2012 | Yoshida et al. |
| 2014/0339724 | A1 | 11/2014 | Yoshida et al. |
| 2015/0280102 | A1* | 10/2015 | Tajitsu ............... H02N 2/18 310/338 |
| 2016/0099403 | A1* | 4/2016 | Tanimoto ............ B32B 27/308 428/336 |
| 2016/0204337 | A1* | 7/2016 | Tanimoto ............ H01L 41/0533 428/355 AC |
| 2016/0284977 | A1 | 9/2016 | Tanimoto et al. |

FOREIGN PATENT DOCUMENTS

| | | |
|---|---|---|
| JP | 2014-093487 A | 5/2014 |
| KR | 10-2008-0072740 A | 8/2008 |
| TW | I405811 B | 8/2013 |
| WO | WO 2007/060930 A1 | 5/2007 |
| WO | WO 2010/104196 A1 | 9/2010 |
| WO | WO 2014/058077 A1 | 4/2014 |
| WO | WO 2015/079899 A1 | 6/2015 |

OTHER PUBLICATIONS

English Translation of JP 2015079899.*
Office Action (Notice of Examination Report) dated Feb. 25, 2020, by the Taiwan Patent Office in corresponding Taiwanese Patent Application No. 105128658 and a partial English Translation of the Office Action. (16 pages).
Notification of Reason for Refusal issued by the Korean Intellectual Property Office in corresponding Korean Patent Application No. 10-2018-7006252 dated Jun. 11, 2019 (21 pages including partial English translation).
Krajewski et al.: "Piezoelectric Force Response of Novel 2D Textile Based PVDF Sensors," IEEE Sensors Journal, vol. 13, No. 12, Dec. 2013, pp. 4743-4748.
Scilingo et al.: "Performance Evaluation of Sensing Fabrics for Monitoring Physiological and Biomechanical Variables," IEEE Transactions on Information Technology in Biomedicine, vol. 9, No. 3, Sep. 2005, pp. 345-352.
International Search Report (PCT/ISA/210) dated Nov. 15, 2016, by the Japan Patent Office as the International Searching Authority for International Application No. PCT/JP2016/076022.
Written Opinion (PCT/ISA/237) dated Nov. 15, 2016, by the Japan Patent Office as the International Searching Authority for International Application No. PCT/JP2016/076022.
Carpi et al., Electroactive Polymer-Based Devices for e-Textiles in Biomedicine, IEEE Transactions on Information Technology in Biomedicine, Sep. 2005, pp. 295-318, vol. 9, No. 3, IEEE Service Center, Los Alamitos, CA, US.

* cited by examiner

ELONGATED PLATE-FORM PIEZOELECTRIC BODY AND PRODUCTION METHOD THEREFOR, LAYERED BODY AND PRODUCTION METHOD THEREFOR, FABRIC, GARMENT, AND BIOLOGICAL INFORMATION ACQUISITION DEVICE

TECHNICAL FIELD

The present invention relates to: an elongated plate-form piezoelectric body and a method of producing the same; a layered body and a method of producing the same; a fabric; a garment; and a biological information acquisition device.

BACKGROUND ART

In recent years, application of a helical chiral polymer-containing piezoelectric body to a piezoelectric device such as a sensor or an actuator has been examined. In such a piezoelectric device, a film-form piezoelectric body is used.

As the helical chiral polymer in the piezoelectric body, the use of an optically active polymer such as a polypeptide or a polylactic acid polymer has been drawing attention. Particularly, it is known that polylactic acid polymers are allowed to express piezoelectric properties by performing only a mechanical stretching operation thereon. It is also known that piezoelectric bodies using a polylactic acid polymer do not require a poling treatment and that their piezoelectric properties do not decline over several years.

For example, as polylactic acid polymer-containing piezoelectric bodies, those having a large piezoelectric constant ($d_{14}$) and excellent transparency have been reported (see, for example, Documents 1 and 2).

Further, recently, attempts have also been made to utilize a piezoelectric material as a fiber or a cloth.

For example, there are known: a piezoelectric fiber which is a flexible string-form material imparted with piezoelectric properties by a piezoelectric material and has electrode films arranged along the longitudinal direction on the opposing surfaces of the string-form material as well as an insulating coating film covering the exterior of the electrode films; and a piezoelectric fabric device (piezoelectric textile) using this piezoelectric fiber (see, for example, Document 3).

Moreover, a piezoelectric element containing a piezoelectric unit that includes two electroconductive fibers and one piezoelectric fiber, which fibers have contact points with each other and are arranged on substantially the same plane, is known (see, for example, Document 4).

[Document 1] Japanese Patent No. 4934235
[Document 2] WO 2010/104196
[Document 3] Japanese Patent No. 4922482
[Document 4] WO 2014/058077

SUMMARY OF INVENTION

Technical Problem

Incidentally, when a film-form piezoelectric body (e.g., any of the piezoelectric bodies in Examples of Documents 1 and 2) is used in a largely irregular place or a place with a large amount of deformation (e.g., when such a piezoelectric body is used as a part or the entirety of a wearable product), damages such as breakage and wrinkling occur in the piezoelectric body due to deformation, and this may consequently reduce the piezoelectric sensitivity (e.g., the sensor sensitivity when the piezoelectric body is used as a sensor, or the dynamic sensitivity when the piezoelectric body is used as an actuator: the same applies below).

In addition, although Document 3 describes a polyvinylidene fluoride (PVDF) as a piezoelectric material, PVDF shows fluctuations in its piezoelectric constant over time, and the piezoelectric constant may be reduced with time. Further, since PVDF is a ferroelectric substance and thus pyroelectric, its piezoelectric signal output may fluctuate due to a change in ambient temperature. Therefore, the piezoelectric fabric device disclosed in Document 3 may be insufficient in terms of the stability in piezoelectric sensitivity (stability against time or temperature change).

Moreover, since the piezoelectric fiber disclosed in Document 4 is a fiber obtained by melt spinning and its cross-section is circular, it is difficult to form a pair of opposing electrode layers on the surface of the piezoelectric fiber. Accordingly, in the piezoelectric element disclosed in Document 4, separately from the piezoelectric fiber, the electroconductive fibers are arranged as electrodes sandwiching the piezoelectric fiber. The piezoelectric element disclosed in Document 4 may be insufficient in terms of the piezoelectric sensitivity due to the long distance between the electrodes sandwiching the piezoelectric fiber, and may be insufficient in terms of the stability in piezoelectric sensitivity due to the absence of adhesion between the piezoelectric fiber and the electrodes.

An object of one mode of the invention is to provide: an elongated plate-form piezoelectric body, a layered body, a fabric, a garment, and a biological information acquisition device, which can be used even in largely irregular places and places with a large amount of deformation and exhibit excellent piezoelectric sensitivity (e.g., excellent sensor sensitivity when used as a sensor, or excellent dynamic sensitivity when used as an actuator) and excellent stability in piezoelectric sensitivity; a method of producing the elongated plate-form piezoelectric body; and a method of producing the layered body.

Solution to Problem

Specific measures to attain the object are as follows.

<1> An elongated plate-form piezoelectric body, which comprises an optically active helical chiral polymer (A) having a weight-average molecular weight of from 50,000 to 1,000,000 and has an elongated plate shape having a thickness of from 0.001 mm to 0.2 mm, a width of from 0.1 mm to 30 mm and a width-to-thickness ratio of 2 or higher, wherein:

a lengthwise direction and a main orientation direction of the helical chiral polymer (A) are substantially parallel to each other, a crystallinity measured by a DSC method is from 20% to 80%, and a birefringence is from 0.01 to 0.03.

<2> The elongated plate-form piezoelectric body according to <1>, wherein the width is from 0.5 mm to 15 mm.

<3> The elongated plate-form piezoelectric body according to <1> or <2>, wherein the length-to-width ratio is 20 or higher.

<4> The elongated plate-form piezoelectric body according to any one of <1> to <3>, wherein the helical chiral polymer (A) is a polylactic acid polymer that has a main chain comprising a repeating unit represented by the following Formula (1):

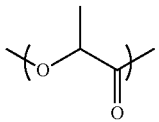

(1)

<5> The elongated plate-form piezoelectric body according to any one of <1> to <4>, wherein the helical chiral polymer (A) has an optical purity of not less than 95.00% ee.

<6> The elongated plate-form piezoelectric body according to any one of <1> to <5>, wherein a content of the helical chiral polymer (A) is not less than 80% by mass.

<7> The elongated plate-form piezoelectric body according to any one of <1> to <6>, which comprises a stabilizer (B) in an amount of from 0.01 parts by mass to 10 parts by mass with respect to 100 parts by mass of the helical chiral polymer (A), the stabilizer (B) comprising at least one functional group selected from the group consisting of a carbodiimide group, an epoxy group and an isocyanate group, and having a weight-average molecular weight of from 200 to 60,000.

<8> A layered body comprising:
the elongated plate-form piezoelectric body according to any one of <1> to <7>; and
a functional layer arranged on a side of at least one main surface of the elongated plate-form piezoelectric body.

<9> The layered body according to <8>, wherein the functional layer comprises at least one of an adhesion promoting layer, a hard coat layer, an antistatic layer, an anti-block layer, a protective layer, or an electrode layer.

<10> The layered body according to <8> or <9>, wherein the functional layer comprises an electrode layer.

<11> The layered body according to <10>, wherein at least one surface layer is the electrode layer.

<12> A fabric having a woven structure comprising the layered body according to <10> or <11>.

<13> The fabric according to <12>, wherein, when viewed from one surface side thereof, the layered body does not include any inverted region, or includes an inverted region whose area accounts for 25% or less of the layered body.

<14> A fabric having a woven structure comprising:
plural first elongated members that are aligned in a single direction; and
plural second elongated members that are aligned in a direction intersecting with the alignment direction of the plural first elongated members in a plane view,
wherein at least one of either the plural first elongated members or the plural second elongated members is the layered body according to <10> or <11>.

<15> A fabric having a woven structure comprising:
plural warp yarns that are aligned in a single direction; and
plural weft yarns that are aligned in a direction intersecting with the alignment direction of the plural warp yarns in a plane view,
wherein:
at least one of the plural warp yarns or at least one of the plural weft yarns comprises the elongated plate-form piezoelectric body according to any one of <1> to <7>, and
a width (a) of the elongated plate-form piezoelectric body and an offset distance (b) of the warp yarns or the weft yarns that are arranged substantially parallel to the elongated plate-form piezoelectric body satisfy the following Formula (I):

$$0.1 < b/a < 4.0 \quad (I).$$

<16> The fabric according to <15>, wherein at least one of the plural warp yarns or at least one of the plural weft yarns is a layered body that comprises a functional layer arranged on a side of at least one main surface of the elongated plate-form piezoelectric body.

<17> The fabric according to <16>, wherein the functional layer is an electrode layer.

<18> A method of producing the elongated plate-form piezoelectric body according to any one of <1> to <7>, the method comprising:
the preparation step of a piezoelectric film which comprises an optically active helical chiral polymer (A) having a weight-average molecular weight of from 50,000 to 1,000,000, and in which a crystallinity determined by a DSC method is from 20% to 80% and a product of a standardized molecular orientation (MORc) measured using a microwave transmission-type molecular orientation meter at a reference thickness of 50 μm and the crystallinity is from 25 to 700; and
the slitting step of the piezoelectric film to obtain the elongated plate-form piezoelectric body.

<19> A method of producing the layered body according to any one of <8> to <11>, the method comprising:
the preparation step of a layered film comprising: a piezoelectric film which comprises an optically active helical chiral polymer (A) having a weight-average molecular weight of from 50,000 to 1,000,000, and in which a crystallinity determined by a DSC method is from 20% to 80% and a product of a standardized molecular orientation (MORc) measured using a microwave transmission-type molecular orientation meter at a reference thickness of 50 μm and the crystallinity is from 25 to 700; and a functional layer arranged on a side of at least one main surface of the piezoelectric film; and
the slitting step of the layered film to obtain the layered body.

<20> A garment comprising the elongated plate-form piezoelectric body according to any one of <1> to <7>, the layered body according to any one of <8> to <11>, or the fabric according to any one of <12> to <17>.

<21> The garment according to <20>, further comprising a fiber structure.

<22> The garment according to <20> or <21>, which is a bottom, a top, a pair of socks, a supporter, or a glove.

<23> A biological information acquisition device comprising the elongated plate-form piezoelectric body according to any one of <1> to <7>, the layered body according to any one of <8> to <11>, or the fabric according to any one of <12> to <17>.

Advantageous Effects of Invention

According to one mode of the invention, an elongated plate-form piezoelectric body, a layered body, a fabric, a garment, and a biological information acquisition device, which can be used even in largely irregular places and places with a large amount of deformation and exhibit excellent piezoelectric sensitivity (e.g., excellent sensor sensitivity when used as a sensor, or excellent dynamic sensitivity when used as an actuator) and excellent stability in piezoelectric sensitivity; a method of producing the elongated plate-form piezoelectric body; and a method of producing the layered body, are provided.

DETAILED DESCRIPTION OF THE INVENTION

Mode for Carrying Out the Invention

Figure 1:
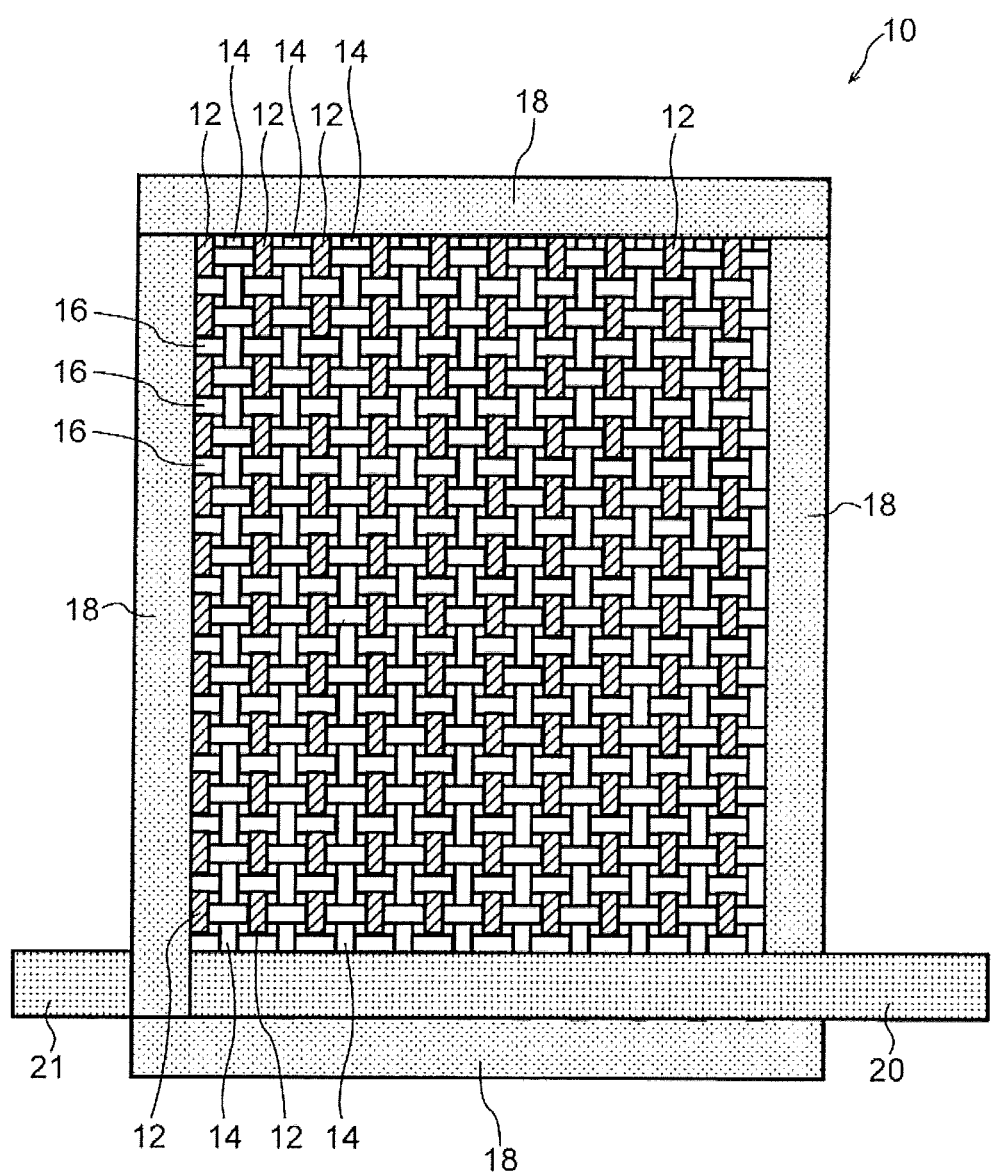
FIG. 1 is a schematic plan view that conceptually illustrates an evaluation sample (extraction electrode-equipped fabric) of Example 1.

Embodiments of the invention are described below.

In the present specification, those numerical ranges that are stated with "to" each denote a range that includes the numerical values stated before and after "to" as the lower and upper limit values, respectively.

In the present specification, a "main surface" of an elongated plate-form piezoelectric body means a surface perpendicular to the thickness direction of the elongated plate-form piezoelectric body (in other words, a surface which includes the lengthwise direction and the widthwise direction). The same applies to a "main surface" of a fabric.

In the present specification, a "surface" of a member means a "main surface" of the member unless otherwise specified.

In the present specification, a thickness, a width and a length satisfy a relationship of thickness<width<length as normally defined.

In the present specification, an angle formed by two lines is indicated in a range of from 0° to 90°.

In the present specification, the term "film" is a concept that encompasses not only those materials that are generally referred to as "films" but also those materials that are generally referred to as "sheets".

In the present specification, the term "MD direction" means the flowing direction of a film (machine direction), namely the stretching direction, and the term "TD direction" means the direction that is perpendicular to the MD direction and parallel to the main surface of the film (transverse direction).

[Elongated Plate-Form Piezoelectric Body]

The elongated plate-form piezoelectric body of the present embodiment contains an optically active helical chiral polymer (A) having a weight-average molecular weight of from 50,000 to 1,000,000, and has an elongated plate shape having a thickness of from 0.001 mm to 0.2 mm, a width of from 0.1 mm to 30 mm and a width-to-thickness ratio of 2 or higher, in which the lengthwise direction and the main orientation direction of the helical chiral polymer (A) are substantially parallel to each other; the crystallinity measured by a DSC method is from 20% to 80%; and the birefringence is from 0.01 to 0.03.

The elongated plate-form piezoelectric body of the present embodiment can be used even in largely irregular places and places with a large amount of deformation and exhibits not only excellent piezoelectric sensitivity (e.g., the sensor sensitivity when used as a sensor or the dynamic sensitivity when used as an actuator; the same applies below) but also excellent stability in piezoelectric sensitivity.

In more detail, in the elongated plate-form piezoelectric body of the present embodiment, piezoelectric properties are ensured by incorporating the helical chiral polymer (A) and controlling the crystallinity to be 20% or higher and the birefringence to be 0.01 or higher. In addition, the elongated plate-form piezoelectric body of the present embodiment has an elongated plate shape having a thickness of from 0.001 mm to 0.2 mm (from 1 μm to 200 μm), a width of from 0.1 mm to 30 mm, and a width-to-thickness ratio of 2 or higher.

As compared to a film-form piezoelectric body (piezoelectric film) that does not have an elongated plate shape, the elongated plate-form piezoelectric body of the present embodiment attains a greater deformation freedom (i.e., superior flexibility) by having the above-described elongated plate shape even in the use in largely irregular places and places with a large amount of deformation. Thus, in the elongated plate-form piezoelectric body of the present embodiment, excellent piezoelectric sensitivity is maintained while damages (e.g., breakage and wrinkling) are inhibited even in the use in largely irregular places and places with a large amount of deformation.

Accordingly, the elongated plate-form piezoelectric body of the present embodiment exhibits not only excellent piezoelectric sensitivity but also excellent stability in piezoelectric sensitivity (particularly, stability against repeated deformation) even when it is used in largely irregular places and places with a large amount of deformation.

Therefore, the elongated plate-form piezoelectric body of the present embodiment can be suitably used as a constituent of, for example, a wearable product (e.g., the below-described fabric).

Further, as shown in Examples of Documents 1 and 2 and the like, from the standpoint of piezoelectric properties (particularly, piezoelectric constant $d_{14}$), a film-form piezoelectric body (piezoelectric film) containing a helical chiral polymer (e.g., polylactic acid) is preferably used in a state of being cut in such a manner that an angle of 45° is formed by the molecular orientation direction (e.g., stretching direction) of the piezoelectric film and a side of the piezoelectric film.

However, according to the studies conducted by the present inventors, it was found that, in an elongated plate-form piezoelectric body containing a helical chiral polymer (i.e., the elongated plate-form piezoelectric body of the present embodiment), sufficient piezoelectric sensitivity can be obtained even when the angle formed by the molecular orientation direction (e.g., stretching direction) of the piezoelectric body and a side of the piezoelectric body is not 45°.

Therefore, as compared to a film-form piezoelectric body containing a helical chiral polymer, the elongated plate-form piezoelectric body of the present embodiment is advantageous in that it can attain sufficient piezoelectric sensitivity even when the angle formed by the molecular orientation direction (e.g., stretching direction) of the piezoelectric body and a side of the piezoelectric body is not 45°, specifically, even when its lengthwise direction and the main orientation direction of the helical chiral polymer (A) are substantially parallel to each other.

In the present embodiment, the point that the lengthwise direction and the main orientation direction of the helical chiral polymer (A) are substantially parallel to each other is advantageous in that it makes the elongated plate-form piezoelectric body strong against tension in the lengthwise direction (i.e., excellent tensile strength in the lengthwise direction). Accordingly, the elongated plate-form piezoelectric body of the present embodiment is unlikely to be broken even when it is largely deformed and thus can be used even in largely irregular places and places with a large amount of deformation.

The point that the lengthwise direction and the main orientation direction of the helical chiral polymer (A) are substantially parallel to each other is also advantageous from the standpoint of the productivity of the elongated plate-form piezoelectric body, for example, the productivity in the process of obtaining the elongated plate-form piezoelectric body by slitting a stretched piezoelectric film.

In the present specification, the term "substantially parallel" means that an angle formed by two lines is from 0° to less than 30° (preferably from 0° to 22.5°, more preferably from 0° to 10°, still more preferably from 0° to 5°, particularly preferably from 0° to 3°).

In the present specification, the "main orientation direction of the helical chiral polymer (A)" means the principal orientation direction of the helical chiral polymer (A). The main orientation direction of the helical chiral polymer (A) can be verified by measuring the below-described molecular orientation ratio (MOR). In cases where the elongated plate-form piezoelectric body is produced through stretching of a film and slitting of the thus stretched film, the "main orientation direction of the helical chiral polymer (A)" in the thus produced elongated plate-form piezoelectric body means the main stretching direction. The term "main stretching direction" used herein refers to the stretching direction in the case of uniaxial stretching, or a stretching direction having a higher stretching ratio in the case of biaxial stretching.

Since the elongated plate-form piezoelectric body of the present embodiment has the above-described elongated plate shape, it is easy to form a pair of opposing electrode layers on the surface of the piezoelectric body, that is, to form an electrode layer on both main surfaces of the piezoelectric body, which is different from the piezoelectric fiber disclosed in Document 4 (e.g., piezoelectric fiber having a circular cross-sectional shape). Therefore, when the elongated plate-form piezoelectric body of the present embodiment is used, the distance between electrodes can be shortened and the piezoelectric sensitivity can thus be improved as compared to a case where the piezoelectric fiber is used.

In addition, when the elongated plate-form piezoelectric body of the present embodiment is used, since the piezoelectric body and the electrode layers can be tightly adhered with each other, the stability of piezoelectric sensitivity can also be improved as compared to a case where the piezoelectric fiber is used.

Moreover, when the elongated plate-form piezoelectric body of the present embodiment is used, since the electrode layers can be formed in the same orientation along the lengthwise direction of the piezoelectric body, superior piezoelectric sensitivity and superior stability in piezoelectric sensitivity are attained as compared to a case where the piezoelectric fiber is used. On the other hand, when the piezoelectric fiber is used, it is difficult to form a pair of opposing electrode layers on the surface of the piezoelectric fiber without causing an electrical short circuit. In addition, even if such electrode layers could be formed on the piezoelectric fiber, since the piezoelectric fiber is easily distorted, it is difficult to form the electrode layers in the same orientation along the lengthwise direction. Moreover, in the production of a fabric using the piezoelectric fiber, it is difficult to arrange the electrode layers in an aligned manner on the main surface of the fabric. Distortion of the electrode layer due to distortion of the fiber may cause a reduction in piezoelectric sensitivity and/or impair the stability in piezoelectric sensitivity.

The elongated plate-form piezoelectric body of the present embodiment contains a helical chiral polymer (A).

As compared to the polyvinylidene fluoride (PVDF) described in Document 3, the helical chiral polymer (A) exhibits less fluctuation hi piezoelectric constant over time and less fluctuation in output due to temperature change. Accordingly, when the elongated plate-form piezoelectric body of the present embodiment is used, the stability in piezoelectric sensitivity (particularly, the stability against time and temperature change) is improved as compared to a case where the piezoelectric fiber disclosed in Document 3 is used.

The elongated plate shape of the elongated plate-form piezoelectric body of the present embodiment is described below in more detail.

The piezoelectric material of the present embodiment has a thickness of from 1 μm to 200 μm.

By controlling the thickness to be 1 μm or greater, the strength of the elongated plate-form piezoelectric body is ensured. In addition, this allows the elongated plate-form piezoelectric body to have excellent production suitability.

Meanwhile, by controlling the thickness to be 200 μm or less, the deformation freedom (flexibility) of the elongated plate-form piezoelectric body in the thickness direction is improved.

The elongated plate-form piezoelectric body of the present embodiment has a width of from 0.1 mm to 30 mm.

By controlling the width to be 0.1 mm or greater, the strength of the elongated plate-form piezoelectric body is ensured. In addition, this allows the elongated plate-form piezoelectric body to have excellent production suitability (e.g., production suitability in the below-described slitting step).

Meanwhile, by controlling the width to be 30 mm or less, the deformation freedom (flexibility) of the elongated plate-form piezoelectric body is improved.

In the elongated plate-form piezoelectric body of the present embodiment, the width-to-thickness ratio (hereinafter, also referred to as "ratio [width/thickness]") is 2 or higher.

By controlling the ratio [width/thickness] to be 2 or higher, since the main surfaces are made clear, it is easy to form electrode layers in the same orientation along the lengthwise direction of the elongated plate-form piezoelectric body (for example, it is easy to form an electrode layer on at least one of the main surfaces). In addition, in the production of a fabric using the elongated plate-form piezoelectric body, it is easy to arrange the electrode layers in an aligned manner on the main surfaces of the fabric. Therefore, not only excellent piezoelectric sensitivity but also excellent stability in piezoelectric sensitivity are attained.

The width of the elongated plate-form piezoelectric body of the present embodiment is preferably from 0.5 mm to 15 mm.

With the width being 0.5 mm or greater, the strength of the elongated plate-form piezoelectric body is further improved. In addition, since distortion of the elongated plate-form piezoelectric body is further suppressed, the piezoelectric sensitivity and the stability thereof are further improved.

Meanwhile, with the width being 15 mm or less, the deformation freedom (flexibility) of the elongated plate-form piezoelectric body is further improved.

In the elongated plate-form piezoelectric body of the present embodiment, the length-to-width ratio (hereinafter, also referred to as "ratio [length/width]") is preferably 20 or higher.

With the ratio [length/width] being 20 or higher, the deformation freedom (flexibility) of the elongated plate-form piezoelectric body is further improved. In addition, in a piezoelectric device (e.g., the below-described fabric) to which the elongated plate-form piezoelectric body is applied, piezoelectric properties can be imparted to a larger area.

In the elongated plate-form piezoelectric body of the present embodiment, the helical chiral polymer (A) is preferably a polylactic acid polymer that has a main chain containing a repeating unit represented by the following Formula (1). This further improves the piezoelectric properties. Moreover, as compared to a PVDF-containing piezoelectric body, the stability in piezoelectric sensitivity against time and temperature change is further improved.

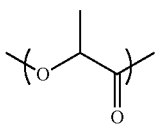

(1)

In the elongated plate-form piezoelectric body of the present embodiment, from the standpoint of further improving the piezoelectric properties, the helical chiral polymer (A) preferably has an optical purity of not less than 95.00% ee.

In the elongated plate-form piezoelectric body of the present embodiment, from the standpoint of further improving the piezoelectric properties, the content of the helical chiral polymer (A) is preferably not less than 80% by mass. The "content of the helical chiral polymer (A)" means the content with respect to the whole elongated plate-form piezoelectric body.

The elongated plate-form piezoelectric body of the present embodiment is described below in more detail.

<Elongated Plate Shape>

The elongated plate-form piezoelectric body of the present embodiment has the above-described elongated plate shape.

Specifically, as described above, the thickness of the elongated plate-form piezoelectric body of the present embodiment is from 0.001 mm to 0.2 mm. The thickness is preferably from 0.01 mm to 0.2 mm, more preferably from 0.02 mm to 0.15 mm, still more preferably from 0.03 mm to 0.1 mm, yet still more preferably from 0.03 mm to 0.07 mm, particularly preferably from 0.04 mm to 0.06 mm.

As described above, the width of the elongated plate-form piezoelectric body of the present embodiment is from 0.1 mm to 30 mm, and it is preferably from 0.5 mm to 15 mm, more preferably from 0.5 mm to 8 mm, still more preferably from 0.5 mm to 6 mm, yet still more preferably from 1 mm to 4 mm, particularly preferably from 1 mm to 3 mm.

In the elongated plate-form piezoelectric body of the present embodiment, as described above, the ratio [width/thickness] is 2 or higher. The ratio [width/thickness] is preferably 5 or higher, more preferably 10 or higher, still more preferably 20 or higher, particularly preferably 100 or higher. It is noted here that the upper limit of the ratio [width/thickness] is automatically determined in accordance with the values of the width and the thickness.

In the elongated plate-form piezoelectric body of the present embodiment, as described above, the length-to-width ratio (hereinafter, also referred to as "ratio [length/width]") is preferably 20 or higher. The ratio [length/width] is more preferably 30 or higher, still more preferably 50 or higher.

The upper limit of the length of the elongated plate-form piezoelectric body of the present embodiment is not particularly restricted. However, from the standpoint of making it easy to apply the elongated plate-form piezoelectric body of the present embodiment to a piezoelectric device, the length of the elongated plate-form piezoelectric body of the present embodiment is preferably 1,000 mm or less, more preferably 500 mm or less, still more preferably 300 mm or less, particularly preferably 100 mm or less.

<Crystallinity>

The crystallinity of the elongated plate-form piezoelectric body of the present embodiment is a value determined by a DSC method.

The crystallinity of the elongated plate-form piezoelectric body of the present embodiment is from 20% to 80%.

By controlling the crystallinity to be 20% or higher, high piezoelectric properties are maintained. Meanwhile, by controlling the crystallinity to be 80% or less, the elongated plate-form piezoelectric body is allowed to maintain high transparency. In addition, when the crystallinity is 80% or less, since whitening and breakage are unlikely to occur during the production of a piezoelectric film used as a raw material of the elongated plate-form piezoelectric body by stretching, the elongated plate-form piezoelectric body is easily produced.

Therefore, the crystallinity of the elongated plate-form piezoelectric body is from 20% to 80%, preferably from 25% to 70%, more preferably from 30% to 50%.

<Birefringence>

The birefringence of the elongated plate-form piezoelectric body of the present embodiment is from 0.01 to 0.03.

The birefringence is a value obtained by dividing the in-plane retardation (i.e., retardation in a plane parallel to the main surface: retardation (Re)) of the elongated plate-form piezoelectric body by the thickness of the elongated plate-form piezoelectric body.

The in-plane retardation can be measured using, for example, a retardation film/optical material analyzer "RETS-100" manufactured by Otsuka Electronics Co., Ltd. or a wide-range birefringence evaluation system "WPA-100" manufactured by Photonic Lattice, Inc.

The birefringence relates to the degree of molecular orientation of the helical chiral polymer (A). A birefringence of higher than 0 means that the helical chiral polymer (A) is oriented.

In the elongated plate-form piezoelectric body of the present embodiment, by controlling the birefringence to be 0.01 or higher, the number of molecular chains (e.g., polylactic acid molecular chains) of the helical chiral polymer (A) that are aligned in one direction (e.g., main stretching direction) is increased, as a result of which sufficient piezoelectric properties are ensured.

When the birefringence is 0.03 or less, the tear strength of the elongated plate-form piezoelectric body (particularly, the strength of the elongated plate-form piezoelectric body against tearing in the lengthwise direction) is ensured. Therefore, the elongated plate-form piezoelectric body of the present embodiment can withstand even the use in largely irregular places and places with a large amount of deformation.

The birefringence of the elongated plate-form piezoelectric body of the present embodiment is from 0.01 to 0.03, preferably 0.012 to 0.028, more preferably from 0.015 to 0.025, still more preferably from 0.018 to 0.024, particularly preferably from 0.020 to 0.023.

<Standardized Molecular Orientation (MORc)>

The elongated plate-form piezoelectric body of the present embodiment preferably has a standardized molecular orientation (MORc) of from 2.0 to 15.0.

The standardized molecular orientation (MORc) is a value defined based on the "molecular orientation ratio (MOR)" which is an index representing the degree of orientation of the helical chiral polymer (A).

The molecular orientation ratio (MOR) is measured by the following microwave measurement method.

That is, plural elongated plate-form piezoelectric bodies are arranged without any gap in a microwave resonant waveguide of a well-known microwave molecular orientation ratio measuring apparatus (also referred to as a "microwave transmission-type molecular orientation meter") such that the main surfaces of the elongated plate-form piezoelectric bodies are perpendicular to the traveling direction of microwaves.

Then, in a state where the sample is continuously irradiated with microwaves whose oscillation is biased in a single direction, the plural elongated plate-form piezoelectric bodies are rotated by 0 to 360° in a plane perpendicular to the traveling direction of the microwaves, and the intensity of the microwaves passing through the sample is measured to determine the molecular orientation ratio (MOR) of each elongated plate-form piezoelectric body.

The standardized molecular orientation (MORc) is the molecular orientation ratio (MOR) at a reference thickness (tc) of 50 μm and can be determined using the following equation:

$$MORc = (tc/t) \times (MOR - 1) + 1$$

(tc: reference thickness for correction, t: thickness of elongated plate-form piezoelectric body)

The standardized molecular orientation (MORc) can be measured using any known molecular orientation meter, such as a microwave-type molecular orientation analyzer MOA-2012A or MOA-6000 manufactured by Oji Scientific Instruments, at a resonance frequency of about 4 GHz or 12 GHz.

In the elongated plate-form piezoelectric body, the standardized molecular orientation (MORc) is preferably from 2.0 to 15.0, more preferably from 2.0 to 10.0, still more preferably from 4.0 to 10.0.

When the standardized molecular orientation (MORc) is 2.0 or higher, a large number of molecular chains (e.g., polylactic acid molecular chains) of the helical chiral polymer (A) are aligned in the stretching direction, as a result of which the oriented crystal generation rate is increased, and this allows the piezoelectric body to express superior piezoelectric properties.

Meanwhile, when the standardized molecular orientation (MORc) is 15.0 or less, the longitudinal tear strength is further improved.

It is noted here that the MORc and the above-described retardation (hereinafter, also referred to as "Δn") are approximately in a linearly proportional relationship, and the MORc is 1 when Δn is 0.

<Product of Standardized Molecular Orientation (MORc) and Crystallinity>

In the elongated plate-form piezoelectric body, the product of the standardized molecular orientation (MORc) and the crystallinity is preferably from 25 to 700, more preferably from 40 to 700, still more preferably from 75 to 680, yet still more preferably from 90 to 660, yet still more preferably from 125 to 650, particularly preferably from 150 to 350. When the product is in a range of from 25 to 700, the elongated plate-form piezoelectric body has a favorable balance between the piezoelectric properties and the transparency and exhibits high dimensional stability.

In the elongated plate-form piezoelectric body of the present embodiment, the product can be adjusted to be in the above-described range by, for example, adjusting the crystallization and stretching conditions in the production of a polymeric piezoelectric film used as a raw material.

<Transparency (Internal Haze)>

In the elongated plate-form piezoelectric body of the present embodiment, transparency is not particularly required; however, of course, the elongated plate-form piezoelectric body of the present embodiment may be transparent.

The transparency of the elongated plate-form piezoelectric body can be evaluated by measuring the internal haze. The "internal haze" of the elongated plate-form piezoelectric body refers to the haze excluding the haze attributed to the outer surface shape of the elongated plate-form piezoelectric body.

In cases where transparency is required, the elongated plate-form piezoelectric body preferably has an internal haze of 5% or less for visible light and, from the standpoint of further improving the transparency and the longitudinal tear strength, the internal haze is more preferably 2.0% or less, still more preferably 1.0% or less. The lower limit value of the internal haze of the elongated plate-form piezoelectric body is not particularly restricted, and the lower limit value is, for example, 0.01%.

The internal haze of the elongated plate-form piezoelectric body is a value measured for the elongated plate-form piezoelectric body having a thickness of from 0.03 mm to 0.05 mm in accordance with JIS K7105 using a haze meter (TC-HIII DPK, manufactured by Tokyo Denshoku Co., Ltd.) at 25° C.

An example of a method of measuring the internal haze of the elongated plate-form piezoelectric body is described below.

First, a sample 1 is prepared by sandwiching only a silicone oil (SHIN-ETSU SILICONE (trademark) manufactured by Shin-Etsu Chemical Co., Ltd., model: KF96-100CS) between two glass plates, and the haze of this sample 1 in the thickness direction (hereinafter, referred to as "haze (H2)") is measured.

Next, a sample 2 in which plural elongated plate-form piezoelectric bodies whose surfaces are uniformly coated with a silicone oil are arranged without any gap and sandwiched between the two glass plates is prepared, and the haze of this sample 2 in the thickness direction (hereinafter, referred to as "haze (H3)") is measured.

Thereafter, the internal haze (H1) of the elongated plate-form piezoelectric bodies is determined by calculating the difference between the thus obtained haze values as in the following equation:

Internal haze($H1$)=Haze($H3$)−Haze($H2$)

The haze (H2) and the haze (H3) are each measured using the following apparatus under the following measurement conditions.

Measuring apparatus: HAZE METER DPK, manufactured by Tokyo Denshoku Co., Ltd.
Sample size: 30 mm (width)×30 mm (length)
Measurement conditions: in accordance with JIS-K7105
Measurement temperature: room temperature (25° C.)

<Helical Chiral Polymer (A)>

The elongated plate-form piezoelectric body of the present embodiment contains an optically active helical chiral polymer (A) having a weight-average molecular weight of from 50,000 to 1,000,000.

The term "optically active helical chiral polymer" used herein refers to a polymer that has a helical molecular structure and exhibits molecular optical activity.

The helical chiral polymer (A) is a polymer having a weight-average molecular weight of from 50,000 to 1,000,000 among such "optically active helical chiral polymers" as described above.

Examples of the helical chiral polymer (A) include polypeptides, cellulose derivatives, polylactic acid polymers, polypropylene oxides, and poly(β-hydroxy butyric acid).

Examples of the polypeptides include poly(γ-benzyl glutarate) and poly(γ-methyl glutarate).

Examples of the cellulose derivatives include cellulose acetate and cyanoethyl cellulose.

From the standpoint of improving the piezoelectric properties of the elongated plate-form piezoelectric body, the optical purity of the helical chiral polymer (A) is preferably not less than 95.00% ee, more preferably not less than 96.00% ee, still more preferably not less than 99.00% ee, yet still more preferably not less than 99.99% ee, particularly preferably 100.00% ee. By controlling the optical purity of the helical chiral polymer (A) in the above-described range, the packing property of polymer crystals exhibiting piezoelectric properties is improved, as a result of which the piezoelectric properties are believed to be improved.

The optical purity of the helical chiral polymer (A) is a value calculated by the following equation:

Optical purity (% $ee$)=100×|$L$-form amount−$D$-form amount|/($L$-form amount+$D$-form amount)

That is, the optical purity of the helical chiral polymer (A) is a value obtained by multiplying [a numerical value obtained by dividing "the difference (absolute value) between the amount (% by mass) of the L-form in the helical chiral polymer (A) and the amount (% by mass) of the D-form in the helical chiral polymer (A)" by "the total of the amount (% by mass) of the L-form and the D-form in the helical chiral polymer (A)"] by 100.

As the amount (% by mass) of the L-form in the helical chiral polymer (A) and the amount (% by mass) of the D-form in the helical chiral polymer (A), values obtained by a method using high-performance liquid chromatography (HPLC) are used. The details of the measurement are specifically described below.

As described above, the helical chiral polymer (A) is preferably a polylactic acid polymer that has a main chain containing a repeating unit represented by Formula (1).

The term "polylactic acid polymer" used herein refers to "a polylactic acid (a polymer consisting of only a repeating unit derived from a monomer selected from L-lactic acid and D-lactic acid)", "a copolymer of L-lactic acid or D-lactic acid and a compound copolymerizable with the L-lactic acid or D-lactic acid", or a mixture thereof.

Among polylactic acid polymers, a polylactic acid is preferred, and a homopolymer (PLLA) of L-lactic acid or a homopolymer (PDLA) of D-lactic acid is particularly preferred.

A polylactic acid is a polymer in which lactic acid is polymerized via ester bonds to form a long chain.

It is known that a polylactic acid can be produced by, for example, a lactide method involving lactide, or a direct polymerization method in which lactic acid is heated in a solvent under reduced pressure and thereby polymerized while removing water.

Examples of a polylactic acid include homopolymers of L-lactic acid, homopolymers of D-lactic acid, block copolymers containing a polymer of at least either of L-lactic acid and D-lactic acid, and graft copolymers containing a polymer of at least either of L-lactic acid and D-lactic acid.

Examples of the above-described "compound copolymerizable with L-lactic acid or D-lactic acid" include hydroxycarboxylic acids, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; cyclic esters, such as glycolide, β-methyl-δ-valerolactone, γ-valerolactone, and ε-caprolactone; polycarboxylic acids, such as oxalic acid, malonic acid, succinic acid, glutaric acid, adipic acid, pimelic acid, azelaic acid, sebacic acid, undecanedioic acid, dodecanedioic acid and terephthalic acid, and anhydrides of these polycarboxylic acids; polyhydric alcohols, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexanedimethanol; polysaccharides such as cellulose; and aminocarboxylic acids such as α-amino acid.

Examples of the above-described "copolymer of L-lactic acid or D-lactic acid and a compound copolymerizable with the L-lactic acid or D-lactic acid" include block copolymers and graft copolymers which have a polylactic acid sequence capable of yielding a helical crystal.

In the helical chiral polymer (A), the concentration of a structure derived from a copolymer component is preferably 20% by mol or less.

For example, when the helical chiral polymer (A) is a polylactic acid polymer, the concentration of a structure derived from a compound copolymerizable with lactic acid (copolymer component) is preferably 20% by mol or less with respect to the total number of moles of a structure derived from lactic acid and the structure derived from the copolymer component in the polylactic acid polymer.

The polylactic acid polymer can be produced by, for example, a method of obtaining a polylactic acid polymer by direct dehydration-condensation of lactic acid as described in Japanese Patent Application Laid-Open (JP-A) Nos. S59-096123 and H7-033861, or a method of obtaining a polylactic acid polymer by ring-opening polymerization of lactide which is a cyclic dimer of lactic acid as described in U.S. Pat. Nos. 2,668,182, 4,057,357 and the like.

Further, in order to allow the polylactic acid polymer obtained by any of the above-described production methods to have an optical purity of not less than 95.00% ee, for example, when a polylactic acid is produced by a lactide method, it is preferred to polymerize lactide whose optical purity has been improved to 95.00% ee or higher by a crystallization operation.

—Weight-Average Molecular Weight—

As described above, the helical chiral polymer (A) has a weight-average molecular weight (Mw) of from 50,000 to 1,000,000.

By controlling the Mw of the helical chiral polymer (A) to be 50,000 or greater, the mechanical strength of the elongated plate-form piezoelectric body is improved. The Mw is preferably 100,000 or greater, and more preferably 200,000 or greater.

Meanwhile, by controlling the Mw of the helical chiral polymer (A) to be 1,000,000 or less, the moldability in the process of obtaining a polymeric piezoelectric film, which is a raw material of the elongated plate-form piezoelectric body, by molding (e.g., extrusion molding) is improved. The Mw is preferably 800,000 or less, more preferably 300,000 or less.

Further, from the standpoint of the strength of the elongated plate-form piezoelectric body, the molecular weight distribution (Mw/Mn) of the helical chiral polymer (A) is preferably from 1.1 to 5, more preferably from 1.2 to 4, still more preferably from 1.4 to 3.

The weight-average molecular weight (Mw) and molecular weight distribution (Mw/Mn) of the helical chiral polymer (A) refer to the Mw and Mw/Mn in terms of polystyrene that are measured by gel permeation chromatography (GPC), respectively. It is noted here that the Mn is the number-average molecular weight of the helical chiral polymer (A).

The methods of measuring the Mw and the Mw/Mn are, for example, as described in Examples below.

As the polylactic acid polymer which is one example of the helical chiral polymer (A), a commercially available polylactic acid can be used.

Examples of the commercially available polylactic acid include PURASORB (PD, PL) manufactured by Purac Inc., LACEA (H-100, H-400) manufactured by Mitsui Chemicals, Inc., and INGEO™ biopolymer manufactured by NatureWorks LLC.

When a polylactic acid polymer is used as the helical chiral polymer (A), it is preferred to produce the polylactic acid polymer by a lactide method or a direct polymerization method so as to allow the polylactic acid polymer to have a weight-average molecular weight (Mw) of 50,000 or greater.

The elongated plate-form piezoelectric body may contain only one type of the above-described helical chiral polymer (A), or two or more types of the helical chiral polymers (A).

From the standpoint of further increasing the piezoelectric constant, the content of the helical chiral polymer (A) (total content when two or more types of the helical chiral polymers (A) are incorporated) in the elongated plate-form piezoelectric body is preferably not less than 80% by mass with respect to the total amount of the elongated plate-form piezoelectric body.

<Stabilizer>

It is preferred that the elongated plate-form piezoelectric body further contains a stabilizer (B) which includes at least one functional group selected from the group consisting of a carbodiimide group, an epoxy group and an isocyanate group in one molecule and has a weight-average molecular weight of from 200 to 60,000. By this, the moist heat resistance can be further improved.

As the stabilizer (B), the "stabilizer (B)" described in the paragraphs [0039] to [0055] of WO 2013/054918 can be used.

Examples of a compound containing a carbodiimide group in one molecule (carbodiimide compound) that can be used as the stabilizer (B) include monocarbodiimide compounds, polycarbodiimide compounds, and cyclic carbodiimide compounds.

As the monocarbodiimide compounds, for example, dicyclohexylcarbodiimide and bis-2,6-diisopropylphenylcarbodiimide are suitable.

As the polycarbodiimide compounds, those which are produced by various methods, such as those produced by a conventional polycarbodiimide production method (e.g., the method disclosed in U.S. Pat. No. 2,941,956, Japanese Patent Publication (JP-B) No. S47-33279, J. Org. Chem. 28, 2069-2075 (1963), or Chemical Review 1981, Vol. 81, No. 4, p. 619-621), can be used. Specifically, the carbodiimide compound described in Japanese Patent No. 4084953 can be used as well.

Examples of such polycarbodiimide compounds include poly(4,4'-dicyclohexylmethanecarbodiimide), poly(N,N-di-2,6-diisopropylphenylcarbodiimide), and poly(1,3,5-triisopropylphenylene-2,4-carbodiimide).

The cyclic carbodiimide compounds can be synthesized in accordance with the method described in JP-A No. 2011-256337 and the like.

As the carbodiimide compound, a commercially available carbodiimide compound may be used, and examples thereof include B2756 (trade name) manufactured by Tokyo Chemical Industry Co., Ltd.; CARBODILITE LA-1 (trade name) manufactured by Nisshinbo Chemical Inc.; and STABAXOL P, STABAXOL P400 and STABAXOL I (all of which are trade names), which are manufactured by Rhein Chemie Rheinau GmbH.

Examples of a compound containing an isocyanate group in one molecule (isocyanate compound) that can be used as the stabilizer (B) include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound containing an epoxy group in one molecule (epoxy compound) that can be used as the stabilizer (B) include phenylglycidyl ether, diethylene glycol diglycidyl ether, bisphenol A-diglycidyl ether, hydrogenated bisphenol A-diglycidyl ether, phenol novolac-type epoxy resins, cresol novolac-type epoxy resins, and epoxidized polybutadienes.

The stabilizer (B) has a weight-average molecular weight of from 200 to 60,000 as described above, and the weight-average molecular weight is preferably from 200 to 30,000, more from 300 to 18,000.

With the molecular weight being in this range, the stabilizer (B) moves more easily, so that an effect of improving the moist heat resistance is exerted more effectively.

The weight-average molecular weight of the stabilizer (B) is particularly preferably from 200 to 900. It is noted here that a weight-average molecular weight of from 200 to 900 is substantially the same as a number-average molecular weight of from 200 to 900. Further, when the weight-average molecular weight is from 200 to 900, the molecular weight distribution may be 1.0 and, in this case, "weight-average molecular weight of from 200 to 900" may be simply referred to as "molecular weight of from 200 to 900".

When the elongated plate-form piezoelectric body contains the stabilizer (B), the elongated plate-form piezoelectric body may contain only one type of stabilizer, or two or more types of stabilizers.

When the elongated plate-form piezoelectric body contains the stabilizer (B), the content of the stabilizer (B) is preferably from 0.01 parts by mass to 10 parts by mass, more preferably from 0.01 parts by mass to 5 parts by mass, still more preferably from 0.1 parts by mass to 3 parts by mass, particularly preferably from 0.5 parts by mass to 2 parts by mass, with respect to 100 parts by mass of the helical chiral polymer (A).

When the content is 0.01 parts by mass or greater, the moist heat resistance is further improved.

Meanwhile, when the content is 10 parts by mass or less, a reduction in transparency is further inhibited.

Examples of a preferred mode of the stabilizer (B) include a mode in which a stabilizer (B1), which includes at least one functional group selected from the group consisting of a carbodiimide group, an epoxy group and an isocyanate group and has a number-average molecular weight of from 200 to 900, and a stabilizer (B2), which includes two or more of at least one functional group selected from the group consisting of a carbodiimide group, an epoxy group and an isocyanate group in one molecule and has a weight-average molecular weight of from 1,000 to 60,000, are used in combination. It is noted here that the weight-average molecular weight of the stabilizer (B1) having a number-average molecular weight of from 200 to 900 is approximately from 200 to 900, and the number-average molecular weight and the weight-average molecular weight of the stabilizer (B1) are thus substantially the same.

When the stabilizer (B1) and the stabilizer (B2) are used in combination as stabilizers, it is preferred that the stabilizer (B1) is incorporated in a greater amount from the standpoint of improving the transparency.

Specifically, from the standpoint of satisfying both transparency and moist heat resistance, the stabilizer (B2) is preferably incorporated in a range of from 10 parts by mass to 150 parts by mass, more preferably in a range of from 50 parts by mass to 100 parts by mass, with respect to 100 parts by mass of the stabilizer (B1).

Specific examples of the stabilizer (B) (stabilizers B-1 to B-3) are shown below.

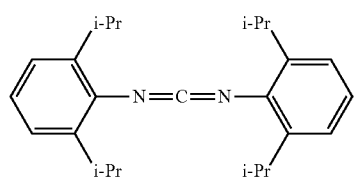

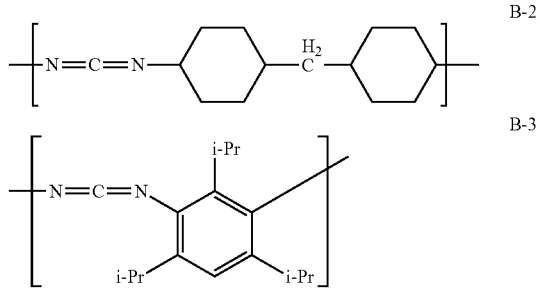

The compound names, commercially available products and the like of the stabilizers B-1 to B-3 are shown below.

Stabilizer B-1: The compound name is "bis-2,6-diisopropylphenylcarbodiimide". The weight-average molecular weight (in this case, equivalent to simple "molecular weight") is 363. Examples of commercially available product include "STABAXOL I" manufactured by Rhein Chemie Rheinau GmbH, and "B2756" manufactured by Tokyo Chemical Industry Co., Ltd.

Stabilizer B-2: The compound name is "poly(4,4'-dicyclohexylmethanecarbodiimide)". Examples of commercially available product having a weight-average molecular weight of about 2,000 include "CARBODILITE LA-1" manufactured by Nisshinbo Chemical Inc.

Stabilizer B-3: The compound name is "poly(1,3,5-triisopropylphenylene-2,4-carbodiimide)". Examples of commercially available product having a weight-average molecular weight of about 3,000 include "STABAXOL P" manufactured by Rhein Chemie Rheinau GmbH, and examples of commercially available product having a weight-average molecular weight of 20,000 include "STABAXOL P400" manufactured by Rhein Chemie Rheinau GmbH.

<Other Components>

The elongated plate-form piezoelectric body may also contain other component(s) as required.

Examples of other components include known resins, such as polyvinylidene fluoride, polyethylene resins and polystyrene resins; known inorganic fillers, such as silica, hydroxyapatite and montmorillonite; known crystal nucleating agents, such as phthalocyanine; and stabilizers other than the stabilizer (B).

Examples of the inorganic fillers and the crystal nucleating agents also include components described in the paragraphs [0057] and [0058] of WO 2013/054918.

[Layered Body]

The layered body of the present embodiment includes: the above-described elongated plate-form piezoelectric body of the present embodiment; and a functional layer arranged on a side of at least one main surface of the elongated plate-form piezoelectric body.

Therefore, according to the layered body of the present embodiment, the same effects as those of the elongated plate-form piezoelectric body of the present embodiment are exerted.

The functional layer may have a monolayer structure, or a structure composed of two or more layers.

For example, in cases where functional layers are arranged on both main surfaces of the elongated plate-form piezoelectric body, the functional layer arranged on one of the main surfaces (hereinafter, also referred to as "front surface" for convenience) and the functional layer arranged on the other main surface (hereinafter, also referred to as "back surface" for convenience) may each independently have a monolayer structure, or a structure composed of two or more layers.

Examples of the functional layer include various functional layers.

Examples thereof include an adhesion promoting layer, a hard coat layer, a refractive index adjusting layer, an anti-reflection layer, an anti-glare layer, a lubricating layer, an anti-block layer, a protective layer, an adhesive layer, an antistatic layer, a heat dissipation layer, a UV absorbing layer, anti-Newton ring layer, a light scattering layer, a polarizing layer, a gas barrier layer, a hue adjusting layer, and an electrode layer.

The functional layer may be composed of two or more of these layers.

Alternatively, the functional layer may be a layer which has two or more of the functions of these layers.

In cases where functional layers are arranged on both main surfaces of the elongated plate-form piezoelectric body, the functional layer arranged on the front surface side and the functional layer arranged on the back surface side may be the same or different.

The effects of the functional layer also include an effect of improving the outer appearance by filling defects, such as a die line and a dent, on the surface of the elongated plate-form piezoelectric body. In this case, the smaller the difference in refractive index between the elongated plate-form piezoelectric body and the functional layer, the lower is the reflection on the interface between the elongated plate-form piezoelectric body and the functional layer, so that the outer appearance is further improved.

The functional layer preferably includes at least one of an adhesion promoting layer, a hard coat layer, an antistatic layer, an anti-block layer, a protective layer, or an electrode layer. This makes the piezoelectric body more easily applicable to a piezoelectric device (e.g., the below-described fabric).

The functional layer more preferably includes an electrode layer.

The electrode layer may be arranged in contact with the elongated plate-form piezoelectric body, or may be arranged via a functional layer other than the electrode layer.

A particularly preferred mode of the layered body of the present embodiment is a mode in which the layered body has functional layers on both main surfaces of the elongated plate-form piezoelectric body and the functional layers on the main surfaces both include an electrode layer.

In the layered body of the present embodiment, it is preferred that at least one of the surface layers is an electrode layer. That is, in the layered body of the present embodiment, at least either the surface layer on the front surface side or the surface layer on the back surface side is preferably an electrode layer (in other words, an electrode layer is exposed).

Since this enables to more simply connect an extraction electrode and the electrode layer(s) of the layered body when the layered body is used as one of the constituents of a piezoelectric device (e.g., the below-described fabric), the productivity of the piezoelectric device is improved.

The term "extraction electrode" used herein refers to an electrode used for electrically connecting the electrode layer(s) of the layered body with an external circuit.

With respect to this mode, in the piezoelectric fiber disclosed in Document 3, since an insulating coating film covering the outer side of an electrode layer is arranged, the method of connecting the electrode layer and an extraction electrode is complex, making the productivity of a piezoelectric device poor.

The material of the functional layer is not particularly restricted, and examples thereof include inorganic materials, such as metals and metal oxides; organic materials such as resins; and complex compositions containing a resin and fine particles. As the resin, for example, a cured resin obtained by curing a resin with heat or active energy ray can be utilized. That is, as the resin, a curable resin can be utilized as well.

The curable resin may be, for example, at least one material (curable resin) selected from the group consisting of acrylic compounds, methacrylic compounds, vinyl-based compounds, allyl-based compounds, urethane-based compounds, epoxy-based compounds, epoxide-based compounds, glycidyl-based compounds, oxetane-based compounds, melamine-based compounds, cellulose-based compounds, ester-based compounds, silane-based compounds, silicone-based compounds, siloxane-based compounds, silica-acryl hybrid compounds, and silica-epoxy hybrid compounds.

Among these compounds, acrylic compounds, epoxy-based compounds, and silane-based compounds are more preferred.

Examples of the metals include at least one selected from Al, Si, Ti, V, Cr, Fe, Co, Ni, Cu, Zn, In, Sn, W, Ag, Au, Pd, Pt, Sb, Ta and Zr; and alloy of these metals.

Examples of the metal oxides include titanium oxide, zirconium oxide, zinc oxide, niobium oxide, antimony oxide, tin oxide, indium oxide, cerium oxide, aluminum oxide, silicon oxide, magnesium oxide, yttrium oxide, ytterbium oxide, and tantalum oxide; and at least one complex oxide of these oxides.

Examples of the fine particles include fine particles of the above-described metal oxides; resin fine particles of a fluorine-based resin, a silicone-based resin, a styrene-based resin, an acrylic resin or the like; and hollow fine particles having a void inside the above-described fine particles.

From the standpoint of transparency, the average primary particle size of the fine particles is preferably from 1 nm to 500 nm, more preferably from 5 nm to 300 nm, still more preferably from 10 nm to 200 nm. Scattering of visible light is inhibited by controlling the average primary particle size to be 500 nm or smaller, while secondary aggregation of the fine particles is inhibited by controlling the average primary particle size to be 1 nm or larger, which are both desirable from the standpoint of maintaining the transparency.

The thickness of the functional layer is not particularly restricted; however, it is preferably in a range of from 0.01 µm to 10 µm.

This upper limit value of the thickness is more preferably 6 µm or less, still more preferably 3 µm or less. Meanwhile, the lower limit value is more preferably not less than 0.01 µm, still more preferably not less than 0.02 µm.

When the functional layer is a multilayer film composed of plural functional layers, the above-described thickness represents the thickness of the whole multilayer film. The functional layers may be arranged on both sides of the elongated plate-form piezoelectric body. Further, the functional layers may each have a different refractive index value.

(Electrode Layer)

As described above, the functional layer preferably includes an electrode layer. Examples of the material of the electrode layer include the above-described metals (e.g., Al) as well as Ag, Au, Cu, Ag—Pd alloy, Ag paste, Cu paste, carbon black, ITO (crystalline ITO and amorphous ITO), ZnO, IGZO, IZO (registered trademark), electroconductive polymers (polythiophene, PEDOT), Ag nanowires, carbon nanotubes, and graphenes.

The electrode layer can be formed by any known method (e.g., a vacuum deposition method, a sputtering method, an ion plating method, a CVD method, an electron beam deposition method, a sol-gel method, a wet coating method, a bar coating method, a screen printing method, or a gravure printing method).

[Fabric]

The fabric of the present embodiment includes the above-described layered body of the present embodiment. As described above, this layered body includes the elongated plate-form piezoelectric body of the present embodiment.

Therefore, according to the fabric of the present embodiment, the same effects as those of the elongated plate-form piezoelectric body of the present embodiment are exerted.

The term "fabric" used herein generally refers to an article obtained by intertwining elongated members to form a woven structure and processing this woven structure into a film form.

The concept of the term "elongated member" used herein encompasses not only "yarns" that are constituents of general fabrics (e.g., "warp yarns" and "weft yarns") and "fibers", but also elongated-form members other than "yarns" and "fibers".

Examples of other elongated-form members include polymer-containing members.

Examples of a polymer in the polymer-containing members include common polymers such as polyesters and polyolefins, as well as helical chiral polymers such as the above-described helical chiral polymer (A).

The concept of polymer-containing members also encompasses the elongated plate-form piezoelectric body of the present embodiment and the layered body of the present embodiment.

The woven structure in the fabric of the present embodiment is not particularly restricted.

Examples of the woven structure include basic woven structures, such as plain weave, twill weave, and satin weave.

The elongated plate-form piezoelectric body may be used as the warp yarns or the weft yarns in the fabric, or may be used as some of the warp yarns or some of the weft yarns.

The yarns and the fibers are not particularly restricted.

Examples of the type of the fibers include polyester fibers, nylon fibers, aramid fibers, acryl fibers, vinylon fibers, polyvinylidene chloride fibers, polyvinyl chloride fibers, polyacrylonitrile fibers, polyethylene fibers, polypropylene fibers, polypropylene fibers, polyurethane fibers, polychlarl fibers, polylactic acid fibers, polyallylate fibers, polyphenylene sulfide fibers, polyimide fibers, fluorine fibers, polyparaphenylene benzoxazole fibers, acetate fibers, promix fibers, viscose fibers, cuprammonium fibers, glass fibers, carbon fibers, metal fibers, and fibers of cotton, hemp, wool, silk and the like.

The form of the fibers may be a monofilament of the fibers, a multifilament of the fibers, or a multifilament in which plural types of fibers are mixed, and the filament may have a core-sheath structure.

Examples of a cross-sectional shape of the fibers include a circular shape, an elliptical shape, a flat shape, a W-shape, a cocoon shape, and a hollow shape.

The usage form of the fibers is not particularly restricted, and the fibers may be used in the form of, for example, a raw yarn, a crimped yarn (e.g., a false-twist yarn), long fibers, a spun yarn, or a composite yarn in which two or more types of fibers are blended by twisting, covering, air-mixing or the like.

The yarns are prepared by twisting the above-described fibers, and the type, form, cross-sectional shape and the usage form of the yarns are the same as those of the fibers.

As the yarns and the fibers, commercially available products may be used as well. Examples thereof include "FAIRLY COTTON", "Munsell MERINO 80 QUEEN" and "QUEEN PEARL LACE #20", which are manufactured by Yuzawaya Shoji Co., Ltd.; "TERRAMAC #20/1" manufactured by UNITIKA Ltd.; "MASTERSEED COTTON <LILY>" manufactured by Diakeito Co., Ltd.; "OPERON RUBBER" manufactured by The BeadSmith; "LOVE BONNY" manufactured by Hamanaka Co., Ltd.; and "MINI-SPORT" manufactured by Daido International Ltd.

The fabric of the present embodiment may be a fabric having a three-dimensional structure. The term "fabric having a three-dimensional structure" used herein refers to a fabric processed to have a stereoscopic configuration by additionally weaving elongated members in the thickness direction of a two-dimensional fabric.

Examples of such a fabric having a three-dimensional structure are described in, for example, Japanese National-Phase Publication (JP-A) No. 2001-513855.

The fabric of the present embodiment may take any constitution as long as at least some of the members constituting the woven structure are constituted by the layered body of the present embodiment.

In the fabric of the present embodiment, it is preferred that, when the fabric is viewed from one side, the layered body does not include any inverted region, or the layered body includes an inverted region whose area accounts for 25% or less in the layered body.

By this, the linearity of the deformation amount and the charge amount is further improved.

It is noted here that the "linearity of the deformation amount and the charge amount" means the linearity of the generated voltage with respect to the amount of deformation applied to the piezoelectric body (in the case of a sensor), or the linearity of the amount of deformation of the piezoelectric body with respect to the amount of voltage applied to the piezoelectric body (in the case of an actuator).

A high linearity of the deformation amount and the voltage means that the fabric can maintain a high piezoelectric sensitivity even in largely irregular places and places with a large amount of deformation.

The phrase "the layered body includes an inverted region" means that, due to the occurrence of distortion around the lengthwise direction of the layered body, the main surface of the layered body on one side and the main surface on the other side are both observed when the fabric is viewed from one side. In this case, when the area of the main surface on one side is different from that of the main surface on the other side, the main surface having a smaller area is defined as "inverted region", while the main surface having a larger area is defined as "non-inverted region". When the main surfaces have the same area, either of them may be defined as "inverted region".

The phrase "when the fabric is viewed from one side, the layered body does not include any inverted region, or the layered body includes an inverted region whose area accounts for 25% or less in the layered body" essentially means that there is no distortion around the lengthwise direction of the layered body, or that the distorsion is inhibited.

Further, in the fabric of the present embodiment, it is preferred that the layered body of the present embodiment is arranged along the direction in which a main surface of the layered body of the present embodiment can be seen when the fabric is viewed from the side of either of its main surfaces. In such a mode, superior piezoelectric properties can be attained.

A fabric X, which is a preferred mode of the fabric of the present embodiment is described below.

The fabric X has a woven structure including: plural first elongated members that are aligned in a single direction; and plural second elongated members that are aligned in a direction intersecting with the alignment direction of the plural first elongated members in a plane view, and this woven structure includes the layered body of the present embodiment (preferably a layered body having an electrode layer, more preferably a layered body in which at least one of the surface layers is an electrode layer).

In the fabric X, the plural first elongated members are aligned in a single direction (i.e., in parallel), and the term "single direction" used herein may encompass variations in the production (in terms of an angle defined in a range of from 0° to 90°, for example, variations of 20° or smaller, preferably 10° or smaller, more preferably 5° or smaller). The same applies to the plural second elongated members.

Further, in the fabric X, the angle formed by the alignment direction of the plural first elongated members and that of the plural second elongated members (which angle is defined in a range of from 0° to 90°) is preferably from 45° to 90°, more preferably from 60° to 90°, still more preferably from 70° to 90°, particularly preferably from 80° to 90°.

In the fabric X, at least one of either the plural first elongated members or the plural second elongated members is preferably the layered body of the present embodiment (more preferably a layered body having an electrode layer, still more preferably a layered body in which at least one of the surface layers is an electrode layer).

That is, in the fabric X, it is preferred that the layered body of the present embodiment (preferably a layered body having an electrode layer, more preferably a layered body in which at least one of the surface layers is an electrode layer) is included in only either of the plural first elongated members and the plural second elongated members and not included in the other plural elongated members.

This enables to inhibit an electrical short circuit at the intersections of the first elongated members and the second elongated members, so that a reduction in piezoelectric sensitivity due to electrical short circuit can be further inhibited.

Moreover, in the present embodiment, among the plural first elongated members and the plural second elongated members, those members other than the layered body of the present embodiment are preferably members having insulating surfaces.

The fabric of the present embodiment may include other constituent(s) in addition to the part having a woven structure (woven structure part).

Examples of other constituents include an extraction electrode, and a reinforcing member.

As described above, the extraction electrode is an electrode used for electrically connecting the electrode layer(s) of the layered body included in the fabric with an external circuit.

When a layered body in which at least one of the surface layers is an electrode layer is used as the layered body included in the fabric, since the electrode layer is exposed, an extraction electrode and the electrode layer can be electrically connected in a simple manner.

The extraction electrode is not particularly restricted, and examples thereof include a member made of the same material as the electrode layer, an electroconductive adhesive tape, an FPC (flexible printed circuit), an ACF (anisotropic conductive film), an ACP (anisotropic conductive paste), and a solder.

The fabric of the present embodiment can be suitably used in various applications where piezoelectric property is required at least partially.

Specific examples of such applications of the fabric of the present embodiment include various clothing items (e.g., shirts, suits, blazers, blouses, coats, jackets, blousons, jumpers, vests, dresses, trousers, skirts, pants, underwear (e.g., slips, petticoats, camisoles, and brassieres), socks, gloves, Japanese clothes, obi material, gold brocades, cool feeling clothes, neckties, handkerchiefs, mufflers, scarfs, stoles, eye masks, tablecloths, footwears (e.g., sneakers, boots, sandals, pumps, mules, slippers, ballet shoes, and kung-fu shoes), towels, pouches, bags (e.g., tote bags, shoulder bags, handbags, pochettes, shopping bags, eco-bags, rucksacks, daypacks, sports bags, Boston bags, waist bags, waist pouches, second bags, clutch bags, vanity bags, accessory pouches, mother bags, party bags, and kimono bags), pouches/cases (e.g., cosmetic pouches, tissue cases, eyeglass cases, pen cases, book jackets, game pouches, key cases, and commuter pass cases), wallets, headgears (e.g., hats, caps, caskets, hunting caps, ten-gallon hats, floppy hats, sun visors, and berets), helmets, headscarfs, belts, aprons, ribbons, corsages, brooches, curtains, wallcloths, seat covers, sheets, quilts, quilt covers, blankets, pillows, pillow cases, sofas, beds, baskets, wrapping materials, room decorations, car accessories, artificial flowers, masks, bandages, ropes, nets, fishing nets, cement reinforcing materials, screen printing meshes, various filters (e.g., for cars and household appliances), various meshes, sheets (e.g., agricultural sheets and leisure sheets), civil engineering fabrics, construction fabrics, and filter cloths.

It is noted here that the above-exemplified articles may be entirely constituted by the fabric of the present embodiment, or only those parts where piezoelectric properties are required may be constituted by the fabric of the present embodiment.

The fabric of the present embodiment is particularly preferably used in wearable products that come into contact with the body.

Modification Example of Fabric

Modification examples of the fabric of the present embodiment include one which includes the layered body of the present embodiment, and one which has the following woven structure. Specifically, the fabric of this modification example has a woven structure including: plural warp yarns that are aligned in a single direction; and plural weft yarns that are aligned in a direction intersecting with the alignment direction of the plural warp yarns in a plane view, in which at least one of the plural warp yarns or at least one of the plural weft yarns includes the above-described elongated plate-form piezoelectric body (preferably a layered body including the above-described functional layer on a side of at least one main surface of the elongated plate-form piezoelectric body, more preferably a layered body including the above-described electrode layer on a side of at least one main surface of the elongated plate-form piezoelectric body), and the width (a) of the elongated plate-form piezoelectric body and the offset distance (b) of the warp yarns or the weft yarns that are arranged substantially parallel to the elongated plate-form piezoelectric body satisfy the following Formula (I):

$$0.1 < b/a < 4.0 \qquad (I)$$

By controlling the ratio (b/a) of the offset distance (b) with respect to the width (a) to be higher than 0.1, even when the fabric is used in largely irregular places and places with a large amount of deformation, the fabric has a large deformation freedom (i.e., excellent flexibility). Thus, even when the fabric of this modification example is used in largely irregular places and places with a large amount of deformation, the fabric maintains excellent piezoelectric sensitivity while inhibiting damage (e.g., breakage and wrinkling) of the piezoelectric body.

Accordingly, even when the fabric of this modification example is used in largely irregular places and places with a large amount of deformation, the fabric has excellent piezoelectric sensitivity and exhibits excellent stability in piezoelectric sensitivity (particularly, stability against repeated deformation) and excellent durability (particularly, a property of inhibiting breakage and wrinkling caused by repeated deformation).

Therefore, the fabric of this modification example can be suitably used as, for example, a constituent of wearable products (e.g., the above-described applications of the fabric).

Meanwhile, by controlling the ratio (b/a) of the offset distance (b) with respect to the width (a) to be less than 4.0, the region of the piezoelectric body in the fabric is increased, and a high output can be obtained because of excellent distortion transmission efficiency. Thus, the fabric of this modification example has excellent piezoelectric sensitivity (e.g., sensor sensitivity when used as a sensor and dynamic sensitivity when used as an actuator.

The elongated plate-form piezoelectric body may be included in at least one of the plural warp yarns or at least one of the plural weft yarns, or may be included in the warp yarns or weft yarns contained in the fabric.

The fabric of this modification example is described below mainly in terms of its differences from the fabric of the present embodiment. It is noted here that descriptions of the matters common to the fabric of the present embodiment are hereinafter omitted.

In the fabric of this modification example, the width (a) of the elongated plate-form piezoelectric body and the offset distance (b) of the warp yarns or the weft yarns that are arranged substantially parallel to the elongated plate-form piezoelectric body satisfies the above-described Formula (I).

As the offset distance (b), the shortest distance between the elongated plate-form piezoelectric body and the warp yarns or the weft yarns that are arranged substantially parallel to the elongated plate-form piezoelectric body is adopted.

The width (a) is preferably from 0.1 mm to 30 mm, more preferably from 0.5 mm to 15 mm, still more preferably from 0.5 mm to 8 mm, yet still more preferably from 0.5 mm to 6 mm, yet still more preferably from 1 mm to 4 mm, particularly preferably from 1 mm to 3 mm.

With the width (a) being 0.1 mm or greater, the strength of the elongated plate-form piezoelectric body is ensured. This also allows the elongated plate-form piezoelectric body to have excellent production suitability (e.g., production suitability in the below-described slitting step). In addition, with the width (a) being 0.5 mm or greater, the strength of the elongated plate-form piezoelectric body is further improved. Moreover, since distortion of the elongated plate-form piezoelectric body is further suppressed, the piezoelectric sensitivity and the stability thereof are further improved.

Meanwhile, with the width (a) being 30 mm or less, the deformation freedom (flexibility) of the elongated plate-form piezoelectric body is improved. In addition, with the width (a) being 15 mm or less, the deformation freedom (flexibility) of the elongated plate-form piezoelectric body is further improved.

The offset distance (b) is preferably from 0.01 mm to 100 mm, more preferably from 0.1 mm to 10 mm, still preferably from 0.3 mm to 5 mm.

With the offset distance (b) being 0.01 mm or greater, the deformation freedom (flexibility) of the fabric is improved.

Meanwhile, with the offset distance (b) being 100 mm or less, since the output from the piezoelectric body is increased, superior piezoelectric sensitivity is attained.

The range of the ratio (b/a) of the offset distance (b) with respect to the width (a) is as indicated in Formula (I), and the meanings of the lower limit value and the upper limit value are as described above.

From the standpoint of durability, the ratio (b/a) is preferably 0.2 or higher, more preferably 0.4 or higher, still more preferably 0.5 or higher. Meanwhile, from the standpoint of piezoelectric sensitivity, the ratio (b/a) is preferably 3.0 or lower, more preferably 2.5 or lower, still more preferably 2.0 or lower.

In the fabric of this modification example, the warp yarns or weft yarns that are arranged substantially parallel to the elongated plate-form piezoelectric body (a first elongated plate-form piezoelectric body) may each be an elongated plate-form piezoelectric body (a second elongated plate-form piezoelectric body), a yarn or a fiber that is a constituent of a general fabric, or other elongated member. These may be used in combination as well.

The second elongated plate-form piezoelectric body may be the same as the first elongated plate-form piezoelectric body, or a different elongated plate-form piezoelectric body. From the standpoint of the productivity of the fabric, it is preferred that the first elongated plate-form piezoelectric body and the second elongated plate-form piezoelectric body are the same elongated plate-form piezoelectric body. The elongated plate-form piezoelectric body contains an optically active helical chiral polymer (A) having a weight-average molecular weight of from 50,000 to 1,000,000, and has an elongated plate shape having a width-to-thickness ratio of 2 or higher, a crystallinity of from 20% to 80% as measured by a DSC method, and a birefringence of from 0.01 to 0.03.

The thickness and the width of the elongated plate-form piezoelectric body used in this modification example are not restricted; however, they are preferably the same as those of the elongated plate-form piezoelectric body of the present embodiment.

In the elongated plate-form piezoelectric body used in this modification example, the ratio of the length with respect to the width (a) (hereinafter, also referred to as "ratio [length/width (a)]") is preferably 10 or higher.

With the ratio [length/width (a)] being 10 or higher, the deformation freedom (flexibility) of the elongated plate-form piezoelectric body is further improved. In addition, in the fabric of this modification example, piezoelectric properties can be imparted to a wider area.

In the elongated plate-form piezoelectric body used in this modification example, it is preferred that the lengthwise direction of the elongated plate-form piezoelectric body and the main orientation direction of the helical chiral polymer (A) are substantially parallel to each other.

When the lengthwise direction of the elongated plate-form piezoelectric body and the main orientation direction of the helical chiral polymer (A) are substantially parallel to each other, there is an advantage that the elongated plate-form piezoelectric body is strong against tension in the lengthwise direction (i.e., excellent tensile strength in the lengthwise direction). Accordingly, the elongated plate-form piezoelectric body is unlikely to be broken even when it is largely deformed and thus can also be used even in largely irregular places and places with a large amount of deformation.

The point that the lengthwise direction and the main orientation direction of the helical chiral polymer (A) are substantially parallel to each other is also advantageous from the standpoint of the productivity of the elongated plate-form piezoelectric body, for example, the productivity in the process of obtaining the elongated plate-form piezoelectric body by slitting a stretched piezoelectric film.

In the fabric of this modification example, it is preferred that, when the fabric is viewed from one side, the layered body does not include any inverted region, or the layered body includes an inverted region whose area accounts for 25% or less in the layered body.

By this, the linearity of the deformation amount and the charge amount as well as the output are further improved.

It is noted here that the "linearity of the deformation amount and the charge amount" means the linearity of the generated voltage with respect to the amount of deformation applied to the piezoelectric body (in the case of a sensor), or the linearity of the amount of deformation of the piezoelectric body with respect to the amount of voltage applied to the piezoelectric body (in the case of an actuator).

A high linearity of the deformation amount and the voltage means that the fabric can maintain a high piezoelectric sensitivity even in largely irregular places and places with a large amount of deformation.

The phrase "the layered body includes an inverted region" means that, due to the occurrence of distortion around the lengthwise direction of the layered body, the main surface of the layered body on one side and the main surface on the other side are both observed when the fabric is viewed from one side. In this case, when the area of the main surface on one side is different from that of the main surface on the other side, the main surface having a smaller area is defined as "inverted region", while the main surface having a larger area is defined as "non-inverted region". When the main surfaces have the same area, either of them may be defined as "inverted region".

The phrase "when the fabric is viewed from one side, the layered body does not include any inverted region, or the layered body includes an inverted region whose area accounts for 25% or less in the layered body" essentially means that there is no distortion around the lengthwise direction of the layered body, or that the torsion is inhibited.

Further, in the fabric of this modification example, it is preferred that the layered body is arranged along the direction in which a main surface of the layered body can be seen when the fabric is viewed from the side of either of its main surfaces. In such a mode, superior piezoelectric properties can be attained.

Use of Elongated Plate-Form Piezoelectric Body, Layered Body, Fabric and Fabric of Modification Example The elongated plate-form piezoelectric body of the present embodiment, the layered body of the present embodiment, and the fabric of the present embodiment can be suitably used in various applications where piezoelectric property is required at least partially.

The elongated plate-form piezoelectric body of the present embodiment, the layered body of the present embodiment, the fabric of the present embodiment, and the fabric of the modification example are preferably used in garments (particularly, garments covering at least a joint of the body).

That is, the garment of the present embodiment includes the elongated plate-form piezoelectric body of the present embodiment, the layered body of the present embodiment, the fabric of the present embodiment, and the fabric of the modification example.

The garment of the present embodiment is preferably one which covers at least a joint of the body. Particularly, the garment of the present embodiment is more preferably one which comes into close contact with at least a joint of the body.

Examples of the garment of the present embodiment include bottoms (e.g., sporting bottoms and inner bottoms) such as spats, tights (e.g., sport tights and compression tights), girdles, pantyhoses, leggings, and leg warmers; tops such as undershirts, shirts, and compression shirts; socks; supporters covering a body part such as neck, shoulder, chest, abdomen, waist, arm, leg, elbow, knee, wrist, or ankle; and gloves.

It is preferred that the garment of the present embodiment further includes a fiber structure.

The fiber structure is preferably one which has elasticity and flexibility (e.g., a supporter for heat insulation or medical use).

The elongated plate-form piezoelectric body of the present embodiment, the layered body of the present embodiment, the fabric of the present embodiment, and the fabric of the modification example can be utilized in, for example, sensor applications (e.g., force sensors such as sitting sensors; ultrasonic sensors; ball-hitting acceleration sensors, impact sensors and the like of various ball-game sporting equipments (e.g., rackets, golf clubs, and bats); touch/impact sensors of stuffed toys; bed watching sensors; security sensors for glass windows, window frames and the like), actuator applications (e.g., sheet transfer devices), energy harvesting applications (e.g., power generation wears and power generation shoes), and healthcare-related applications (e.g., wearable motion sensors obtained by installing the above-described sensors to various garments (e.g., T-shirts, sports wears, spats, and socks), supporters, plaster casts, diapers, seats of infant push carts, wheelchair seats, medical incubator mats, shoes, shoe insoles, watches, and the like).

The elongated plate-form piezoelectric body of the present embodiment, the layered body of the present embodiment, the fabric of the present embodiment, and the fabric of the modification example can also be used in applications other than the above-described ones.

Examples of other applications include beddings for rollover detection; carpets for motion detection; insoles for motion detection; chest bands for respiration detection; masks for respiration detection; arm bands for strain detection; leg bands for strain detection; seats for seating detection; and stuffed toys, stuffed toy-type social robots and the like that are capable of differentiating contact states. In the stuffed toys, stuffed toy-type social robots and the like that are capable of differentiating contact states, for example, changes in pressure are detected by a contact sensor locally arranged in the stuffed toys and the like, and human actions of, for example, "rubbing", "hitting" and "pulling" the stuffed toys and the like can be differentiated from one another.

The elongated plate-form piezoelectric body of the present embodiment, the layered body of the present embodiment, the fabric of the present embodiment, and the fabric of the modification example are also preferably used in biological information acquisition devices.

That is, the biological information acquisition device of the present embodiment includes the elongated plate-form piezoelectric body of the present embodiment, the layered body of the present embodiment, or the fabric of the present embodiment.

The biological information acquisition device of the present embodiment is a device for acquiring biological information of a tested person or animal (hereinafter, collectively referred to as "test subject") by detecting a biological signal of the test subject using the above-described elongated plate-form piezoelectric body, layered body or fabric.

Examples of the biological signal include a pulse wave signal, a respiration signal, a motion signal, a cardiac action, and a body tremor.

The body tremor refers to a rhythmic involuntary movement of a body part (e.g., finger, hand, forearm, or upper limb).

The detection of the cardiac action also includes detection of an effect of a force exerted by the cardiac function of the body.

That is, when the heart pumps blood to the aorta and the pulmonary artery, the body is subjected to a reaction force in the direction opposite to the blood flow. The size and the direction of this reaction force vary with the functional stages of the heart. The reaction force is detected by sensing the cardiac actions on the outside of the body.

The biological information acquisition device is arranged in various articles, such as clothing items (e.g., shirts, suits, blazers, blouses, coats, jackets, blousons, jumper coats, vests, dresses, trousers, pants, underwear (e.g., slips, petticoats, camisoles, and brassieres), socks, gloves, Japanese clothes, obi materials, gold brocades, cool feeling clothes, neckties, handkerchiefs, mufflers, scarfs, stoles, and eye masks), supporters (e.g., neck supporters, shoulder supporters, chest supporters, abdominal supporters, waist supporters, arm supporters, leg supporters, elbow supporters, knee supporters, wrist supporters, and ankle supporters), footwears (e.g., sneakers, boots, sandals, pumps, mules, slippers, ballet shoes, and kung-fu shoes), insoles, towels, rucksacks, headgears (e.g., hats, caps, caskets, hunting caps, ten-gallon hats, floppy hats, sun visors, and berets), helmets, helmet chin straps, headscarfs, belts, seat covers, sheets, floor cushions, cushions, quilts, quilt covers, blankets, pillows, pillow cases, sofas, chairs, seats, seating units, beds, bed pads, carpets, baskets, masks, dressing bandages, ropes, and various nets.

The articles to be provided with the biological information acquisition device are preferably those articles that are subjected to the body weight of a test subject, such as footwears, insoles, sheets, floor cushions, cushions, quilts, quilt covers, pillows, pillow cases, sofas, chairs, seats, seating units, beds, carpets, and mats. More specifically, the articles are preferably, for example, seats, seating sections, wheels, infant fall prevention stoppers and the like of infant push carts; seats, seating sections and the like of wheelchairs; and mats of medical incubators.

One example of the actions of the biological information acquisition device is described below.

The biological information acquisition device is arranged on, for example, a bed or the seating surface of a chair. A test subject lies, sits or stands on this biological information acquisition device. In this state, by a biological signal generated by the test subject (e.g., body motion, periodic vibration (e.g., pulse or respiration), or change in the heart rate caused by a human emotion, such as a sense of "cuteness" or "fear"), the elongated plate-form piezoelectric body, layered body or fabric of the biological information acquisition device is pressurized to be compressed and deformed, and an electrical potential is generated in association with this compressive deformation. The electrical potential changes over time in accordance with the biological signal generated by the test subject. For example, when the biological signal generated by the test subject is periodic vibration such as pulse or respiration, the electrical potential generated in the elongated plate-form piezoelectric body, layered body or fabric also changes periodically.

The changes over time in the electrical potential generated in association with the compressive deformation are determined by a measurement module. The thus obtained changes over time in the electrical potential form a composite wave of plural biological signals (pulse wave signal, respiration signal and body motion signal). This composite wave is separated into signals of respective frequencies based on Fourier transformation, whereby separated signals are generated. These separated signals are each inverse-Fourier-transformed to obtain biological signals corresponding to the respective separated signals.

For example, as illustrated in the below-described Example 9 and FIG. 9, when the biological signals generated by a test subject form a composite wave of pulse signal and respiration signal, the electrical potential generated in association with compressive deformation of the elongated plate-form piezoelectric body, layered body or fabric of the biological information acquisition device changes periodically over time.

Humans generally have a pulse rate of from 50 to 90 beats per minute and a pulse frequency of from 0.6 to 3 Hz. Further, humans generally have a respiration rate of from 16 to 18 times per minute and a respiration frequency of from 0.1 to 1 Hz. Moreover, humans generally have a body motion frequency of not less than 10 Hz.

Based on these criteria, the composite wave of plural biological signals can be separated into individual biological signals. The separation of the composite wave of plural biological signals into individual biological signals is carried out by the above-described Fourier transformation and inverse Fourier transformation using, for example, a biological signal report program.

The composite wave of plural biological signals can be separated into each of the plural biological signals in the above-described manner.

Further, biological signal data may be generated on the basis of at least one of the thus separated biological signals.

The biological signal data is not particularly restricted as long as it is calculated based on a biological signal. Examples of such biological signal data include the number of biological signals per unit time, and the average number of past biological signals.

[Method of Producing Elongated Plate-Form Piezoelectric Body]

A method of producing the above-described elongated plate-form piezoelectric body of the present embodiment is not particularly restricted; however, the following production method is preferred.

That is, a preferred method of producing the elongated plate-form piezoelectric body includes: the preparation step of preparing a piezoelectric film which contains an optically active helical chiral polymer (A) having a weight-average molecular weight of from 50,000 to 1,000,000, and in which the crystallinity determined by a DSC method is from 20% to 80% and a product of the standardized molecular orientation (MORc) measured using a microwave transmission-type molecular orientation meter at a reference thickness of 50 μm and the crystallinity is from 25 to 700; and the slitting step of slitting the piezoelectric film to obtain the elongated plate-form piezoelectric body.

The preferred method of producing the elongated plate-form piezoelectric body may further include other step(s) as required.

<Preparation Step>

The preparation step is the step of preparing the above-described piezoelectric film.

The preparation step is a step defined for convenience and may be the step of producing the piezoelectric film, or the step of merely preparing the piezoelectric film that has been produced in advance.

The piezoelectric film contains an optically active helical chiral polymer (A) having a weight-average molecular weight of from 50,000 to 1,000,000 and, in the piezoelectric film, the crystallinity determined by a DSC method is from 20% to 80%, and a product of the standardized molecular orientation (MORc), which is measured using a microwave transmission-type molecular orientation meter at a reference thickness of 50 μm, and the crystallinity is from 25 to 700.

The helical chiral polymer (A) and the crystallinity in the piezoelectric film are the same as those in the above-described elongated plate-form piezoelectric body, and the preferred mode is also the same.

The standardized molecular orientation (MORc) and the product of the standardized molecular orientation (MORc) and the crystallinity are also the same as in the preferred mode of the elongated plate-form piezoelectric body.

One example of a method of measuring the piezoelectric constant ($d_{14}$) of the piezoelectric film (stress-charge method) is described in the section of Examples below.

In cases where a piezoelectric film is produced in the preparation step, the method of producing the piezoelectric film is not particularly restricted, an any known method can be employed.

Examples of the method of producing the piezoelectric film include a method in which a raw material containing the helical chiral polymer (A) is molded into the form of a film to obtain an unstretched film, and the thus obtained unstretched film is subsequently subjected to stretching and crystallization. The stretching and the crystallization may be performed in any order. Alternatively, as in Examples described below, a method of sequentially subjecting an unstretched film to pre-crystallization, stretching and crystallization (annealing) may be employed. The stretching may be uniaxial stretching or biaxial stretching. In the case of biaxial stretching, the stretching ratio in either direction (main stretching direction) is preferably high.

With regard to the method of producing the piezoelectric film, reference can be made to known documents such as Japanese Patent No. 4934235, WO 2010/104196, WO 2013/054918, and WO 2013/089148 as appropriate.

<Slitting Step>

The slitting step is the step of slitting the above-described piezoelectric film to obtain the elongated plate-form piezoelectric body of the present embodiment.

The term "slitting" used herein means cutting the piezoelectric film into an elongated shape.

The slitting is performed by, for example, feeding the piezoelectric film to a cutting machine (e.g., a slitter) equipped with a slitting blade, such as a razor blade or a rotary shah (rotary knife), and cutting the piezoelectric film into an elongated shape. The slitting may be performed for each film at a time, or continuously in a roll-to-roll manner.

In the slitting step, the relationship between the slitting direction and the main stretching direction of the piezoelectric film is not particularly restricted.

The reason for this is because it was discovered that, as described above, the elongated plate-form piezoelectric body of the present embodiment can attain sufficient piezoelectric sensitivity regardless of the angle formed by the molecular orientation direction (e.g., stretching direction) of the piezoelectric body and a side of the piezoelectric body.

However, from the standpoint of productivity, it is preferred that the slitting direction and the main stretching direction of the piezoelectric film are substantially parallel to each other. In addition, when the slitting is performed in this direction, since the lengthwise direction of the elongated plate-form piezoelectric body is the main stretching direction, the elongated plate-form piezoelectric body is strong against tension in the lengthwise direction and thus unlikely to be broken even when a large deformation is applied thereto, which is preferred.

[Method of Producing Layered Body]

A method of producing the above-described layered body of the present embodiment is not particularly restricted; however, the following production method is preferred.

That is, a preferred method of producing the layered body includes:

the preparation step of preparing a layered film including: a piezoelectric film which contains an optically active helical chiral polymer (A) having a weight-average molecular weight of from 50,000 to 1,000,000, and in which the crystallinity determined by a DSC method is from 20% to 80% and a product of the standardized molecular orientation (MORc) measured using a microwave transmission-type molecular orientation meter at a reference thickness of 50 μm and the crystallinity is from 25 to 700; and a functional layer arranged on a side of at least one of surface of the piezoelectric film; and the slitting step of slitting the layered film to obtain the layered body.

The preferred method of producing the layered body may further include other step(s) as required.

<Preparation Step>

The preparation step in the preferred method of producing the layered body is the step of preparing the above-described layered film.

The preparation step is a step defined for convenience and may be the step of producing the layered film, or the step of merely preparing the layered film that has been produced in advance.

The piezoelectric film in the layered film is the same as the piezoelectric film described above in the section of "Method of Producing Elongated Plate-form Piezoelectric Body".

The functional layer in the layered film is the same as the functional layer described above in the section of "Layered body".

<Slitting Step>

The slitting step is the step of slitting the above-described layered film to obtain the layered body of the present embodiment.

The slitting step in the preferred method of producing the layered body is the same as the slitting step in the "preferred method of producing the elongated plate-form piezoelectric body", except that the subject of the slitting is the layered film, not the piezoelectric film.

It is noted here that the method of producing the layered body of the present embodiment is not restricted to the above-described preferred production method and may be a process of first slitting the piezoelectric film to obtain an elongated plate-form piezoelectric body and subsequently forming a functional group on at least one of the main surfaces of the thus obtained elongated plate-form piezoelectric body.

EXAMPLES

The invention will now be described more concretely by way of examples thereof; however, the invention is not restricted to the following examples as long as they do not depart from the gist of the invention.

Example 1

<Production of Piezoelectric Film>

As a helical chiral polymer (A), a polylactic acid (product name: INGEO™ BIOPOLYMER, brand: 4032D, weight-average molecular weight (Mw): 200,000, melting point (Tm): 166° C., glass transition temperature (Tg): from 57° C. to 60° C.) manufactured by Nature Works LLC was prepared. This polylactic acid (100 parts by mass) and the below-described stabilizer X (1.0 part by mass) were dry-blended to prepare a raw material.

The thus obtained raw material was placed in a hopper of an extrusion molding machine, extruded from a T-die while being heated to a temperature of from 220° C. to 230° C., and then brought into contact with a 50° C. casting roll for 0.3 minutes, whereby a 0.15 mm-thick pre-crystallized sheet was formed (pre-crystallization step). The crystallinity of this pre-crystallized sheet was measured to be 6%.

Stretching of the thus obtained pre-crystallized sheet was initiated at a stretching rate of 3 m/min in a roll-to-roll manner while heating the pre-crystallized sheet to 70° C., and the pre-crystallized sheet was uniaxially stretched in the MD direction to a stretching ratio of 3.5 times (stretching step). The thus obtained uniaxially stretched film had a thickness of 0.05 mm.

This uniaxially stretched film was brought into contact with a roll heated to 145° C. for 15 seconds and thereby annealed, after which the thus annealed film was rapidly cooled to obtain a 0.05 mm-thick piezoelectric film (annealing step).

—Stabilizer X—

As a stabilizer X, a mixture of STABAXOL P400 manufactured by Rhein Chemie Rheinau GmbH (20 parts by mass), STABAXOL I manufactured by Rhein Chemie Rheinau GmbH (50 parts by mass) and CARBODILITE LA-1 manufactured by Nisshinbo Chemical Inc. (30 parts by mass) was used.

The details of the respective components in the mixture are as follows.

STABAXOL I: bis-2,6-diisopropylphenylcarbodiimide (molecular weight (=weight-average molecular weight): 363)

STABAXOL P400: poly(1,3,5-triisopropylphenylene-2,4-carbodiimide) (weight-average molecular weight: 20,000)

CARBODILITE LA-1: poly(4,4'-dicyclohexylmethane-carbodiimide) (weight-average molecular weight: about 2,000)

<Measurement of Optical Purity of Polylactic Acid>

A sample (piezoelectric film) in an amount of 1.0 g was weighed and placed in a 50-mL Erlenmeyer flask, and 2.5 mL of IPA (isopropyl alcohol) and 5 mL of 5.0 mol/L sodium hydroxide solution were added thereto. Then, the Erlenmeyer flask containing the sample solution was placed in a 40° C. water bath, and the sample solution was stirred for about 5 hours until the polylactic acid was completely hydrolyzed.

After allowing the sample solution to cool to room temperature, 20 mL of 1.0 mol/L hydrochloric acid solution was added thereto to neutralize the sample solution, and the thus neutralized sample solution was thoroughly stirred with the Erlenmeyer flask being tightly sealed. Then, 1.0 mL of this sample solution was transferred to a 25-mL volumetric flask, and a mobile phase was added thereto to a volume of 25 mL, whereby an HPLC sample solution 1 was prepared. Thereafter, 5 µL of this HPLC sample solution 1 was injected into an HPLC apparatus, and the peak area was determined for the D- and L-forms of the polylactic acid under the following HPLC conditions to calculate the amount of the L-form and the amount of D-form. Based on the thus obtained results, the optical purity (% ee) was determined.

—HPLC Measurement Conditions—

Column

Optical resolution column, SUMICHIRAL OA5000, manufactured by Sumika Chemical Analysis Service, Ltd.

Measuring Apparatus

Liquid chromatography, manufactured by JASCO Corporation

Column Temperature

25° C.

Mobile Phase 1.0 mM copper (II) sulfate buffer/IPA=98/2 (V/V)

copper (II) sulfate/IPA/water=156.4 mg/20 mL/980 mL

Mobile Phase Flow Rate 1.0 mL/min

Detector

UV detector (UV: 254 nm)

As a result of the above-described measurement, it was found that the polylactic acid in the piezoelectric film contained L-form as a main component and had an optical purity of 97.00% ee.

<Weight-Average Molecular Weight (Mw) and Molecular Weight Distribution (Mw/Mn) of Polylactic Acid>

By gel permeation chromatography (GPC), the weight-average molecular weight (Mw) and the molecular weight distribution (Mw/Mn) of the polylactic acid in the piezoelectric film were measured as follows.

First, the piezoelectric film was dissolved in a solvent (chloroform) at 40° C. to prepare a sample solution having a concentration of 1 mg/mL.

Then, 0.1 mL of the thus obtained sample solution was introduced to a column containing a solvent (chloroform) at a temperature of 40° C. and a flow rate of 1 mL/min, and the sample concentration in the sample solution separated by the column was measured using a differential refractometer. A universal calibration curve was separately prepared using a polystyrene standard sample and, based on this universal calibration curve and the measurement result of the sample concentration, the weight-average molecular weight (Mw) and the molecular weight distribution (Mw/Mn) of the polylactic acid were determined.

As the GPC measuring apparatus and the column, the following products were used.

—GPC Measuring Apparatus—
GPC-100 manufactured by Waters Corp.
—Column—
SHODEX LF-804, manufactured by Showa Denko K.K.

As a result of the above-described measurement, it was found that the polylactic acid in the piezoelectric film had a Mw of 200,000 and a Mw/Mn of 1.87.

<Melting Point (Tm) and Crystallinity of Piezoelectric Film>

A sample in an amount of 10 mg was collected from the piezoelectric film and measured using a differential scanning calorimeter (DSC-1, manufactured by Perkin Elmer Co., Ltd.) at a heating rate of 10° C./min to obtain a melting endothermic curve. From the thus obtained melting endothermic curve, the melting point (Tm) and the crystallinity of the piezoelectric film were determined.

As a result, it was found that the piezoelectric film had a melting point (Tm) of 165.4° C. and a crystallinity of 41.8%.

<Standardized Molecular Orientation (MORc) of Piezoelectric Film>

The standardized molecular orientation (MORc) of the piezoelectric film was measured using a microwave-type molecular orientation meter MOA6000 (manufactured by Oji Scientific Instruments Co., Ltd.). The reference thickness (tc) was set at 0.05 mm.

As a result, the MORc was found to be 4.72.

<Production of Layered Film>

Using a vapor deposition apparatus (SIP-600, manufactured by Showa Shinku Co., Ltd.), 50 nm-thick aluminum electrode layers (Al electrode layers) were each formed by vapor deposition on both sides of the piezoelectric film, whereby a layered film having a layered structure of Al electrode layer/piezoelectric film/Al electrode layer was obtained.

<Measurement of Piezoelectric Constant ($d_{14}$) of Piezoelectric Film (Stress-Charge Method)>

A rectangular test piece was prepared by cutting the thus obtained layered film into a size of 150 mm in a 45° direction with respect to the stretching direction (MD direction) of the piezoelectric film and 50 mm in the direction perpendicular to the 45° direction. The thus obtained 150 mm×50 mm test piece was further cut into a size of 120 mm in the 45° direction with respect to the stretching direction (MD direction) of the piezoelectric film and 10 mm in the direction perpendicular to the 45° direction, whereby a 120 mm×10 mm rectangular film (hereinafter, referred to as "sample") was obtained.

The thus obtained sample was set in a tensile tester (TENSILON RTG-1250, manufactured by A&D Co., Ltd.) having a chuck-to-chuck distance of 70 mm such that the sample would not become loose. A force was applied periodically at a crosshead speed of 5 mm/min such that the applied force reciprocated between 4 N and 9 N. In this process, in order to measure the amount of change occurring in the sample in response to the applied force, a capacitor having an electrostatic capacity Qm (F) was connected in parallel to the sample, and the voltage Vm between the terminals of this capacitor Cm (95 nF) was measured via a buffer amplifier. The amount of the change Q (C) was calculated as a product of the capacitor capacitance (Cm) and the voltage between the terminals (Vm).

The piezoelectric constant ($d_{14}$) was calculated by the following equation:

$$d_{14}=(2\times t)/L\times Cm\cdot \Delta Vm/\Delta F$$

t: Sample thickness (m)
L: Chuck-to-chuck distance (m)
Cm: Capacitance of capacitor connected in parallel (F)
$\Delta Vm/\Delta F$: Ratio of the amount of change in voltage between capacitor terminals with respect to the amount of change in force As a result of the above-described measurement, the piezoelectric constant $d_{14}$ (stress-charge method) of the layered film was found to be 6.4 pC/N.

<Production of 3 mm-Wide Layered Body (with Electrodes)>

The layered film was slitted using a cutting machine (CAMM-1 SERVO GX-24, manufactured by Roland DGA Corporation) to obtain a 200 mm (length)×3 mm (width) elongated plate-form layered body (3 mm-wide layered body).

The slitting was performed in such a direction that the lengthwise direction of the layered body corresponded to the stretching direction (MD direction) of the piezoelectric film and the width direction of the layered body corresponded to the TD direction of the piezoelectric film.

<Measurement of Birefringence of 3 mm-Wide Piezoelectric Body>

The Al electrode layers on both sides of the thus obtained 3 mm-wide layered body (with electrodes) were removed using a duct tape, and the birefringence of the 3 mm-wide piezoelectric body contained in the 3 mm-wide layered body was measured. The birefringence was determined by measuring the in-plane retardation of the 3 mm-wide piezoelectric body under the following measurement conditions and then dividing the thus obtained value of the in-plane retardation by the thickness of the 3 mm-wide piezoelectric body.

As a result, the birefringence of the 3 mm-wide piezoelectric body was found to be 0.0214.

—In-Plane Retardation Measurement Conditions—
Measuring wavelength: 550 nm
Measuring apparatus: a retardation film/optical material analyzer "RETS-100", manufactured by Otsuka Electronics Co., Ltd.

<Production of 3 mm-Wide Piezoelectric Body (with No Electrode)>

A 3 mm-wide piezoelectric body (with no electrode) was obtained in the same manner as in the production of the 3 mm-wide layered body (with electrodes), except that the layered film was changed to the piezoelectric film.

<Production of Fabric>

The 3 mm-wide layered body (with electrodes) and the 3 mm-wide piezoelectric body (with no electrode) were arranged alternately and in parallel to one another.

Next, using the thus alternately arranged 3 mm-wide layered bodies (with electrodes) and 3 mm-wide piezoelectric bodies (with no electrode) as warp yarn-equivalent members (hereinafter, also referred to as "warp yarns" for convenience) and the 3 mm-wide piezoelectric bodies (with no electrode) as weft yarn-equivalent members (hereinafter, also referred to as "weft yarns" for convenience), a plain weave structure was formed to obtain a fabric.

The formation of the plain weave structure was performed such that, when viewed from the side of a main surface of the fabric, the main surfaces of the 3 mm-wide layered bodies and the 3 mm-wide piezoelectric bodies were visible. In this process, inversion (distortion in the lengthwise direction) was inhibited in all of the layered bodies and piezoelectric bodies.

<Production of Evaluation Sample (Extraction Electrode-Equipped Fabric)>

An area of 75 mm (long side)×55 mm (short side) of the thus obtained fabric was defined as an evaluation area, and the periphery of this evaluation area was immobilized using a mending tape. In this process, the evaluation area was immobilized such that its long side was aligned with the direction of the warp yarns.

Next, the part outside the part immobilized with the mending tape was cut off.

Then, as a front surface-side extraction electrode, an electroconductive copper foil adhesive tape (manufactured by Teraoka Seisakusho Co., Ltd., product number: 8323) was pasted to one side of the fabric (hereinafter, referred to as "front surface"), and this front surface-side extraction electrode was used to electrically connect the front surface-side electrode layers of all of the 3 mm-wide layered bodies.

Thereafter, as a back surface-side extraction electrode, the above-described electroconductive copper foil adhesive tape was pasted in the same manner on the other side of the fabric as well (hereinafter, referred to as "back surface"), and this back surface-side extraction electrode was used to electrically connect the back surface-side electrode layers of all of the 3 mm-wide layered bodies.

In the above-described processes, attention was paid such that a short circuit would not occur between the front surface-side extraction electrode and the back surface-side extraction electrode.

In the above-described manner, an evaluation sample (extraction electrode-equipped fabric) was obtained.

FIG. 1 is a schematic plan view that conceptually illustrates the evaluation sample (extraction electrode-equipped fabric) prepared above.

An extraction electrode-equipped fabric 10 (evaluation sample) prepared in Example 1 includes: 3 mm-wide layered bodies 12 and 3 mm-wide piezoelectric bodies 14, which are arranged alternately and in parallel to one another, as warp yarns; and 3 mm-wide piezoelectric bodies 16 as weft yarns. In the extraction electrode-equipped fabric 10, a plain weave fabric is formed by these warp yarns and weft yarns. In the fabric, a mending tape 18 is pasted in such a manner to surround an evaluation area having a size of 75 mm (long side: warp yarn direction)×55 mm (short side: weft yarn direction). On the front surface of the fabric, a front surface-side extraction electrode 20 is pasted and, on the back surface of the fabric, a back surface-side extraction electrode 21 is pasted.

Hereinafter, in all of the drawings below, the same members are assigned with the same symbols, and redundant descriptions may be omitted.

<Evaluations>

The evaluation sample (extraction electrode-equipped fabric) was subjected to the following evaluations.

The results thereof are shown in Table 1.

It is noted here that the following evaluations were performed assuming a case where the extraction electrode-equipped fabric is used as a sensor for detecting human motion (e.g., movement of a human joint).

In the following evaluations, as a member imitating a human joint, a bend-deformable urethane foam having a semi-circular cross-sectional shape was used.

(Evaluation of Waveform Shape and Repeated Reproducibility)

In order to evaluate the sensor sensitivity of the fabric and the repetition stability in sensor sensitivity of the fabric, the waveform shape and the repeated reproducibility were evaluated for the extraction electrode-equipped fabric. The details thereof are described below referring to FIGS. 2 and 3.

Figure 2:
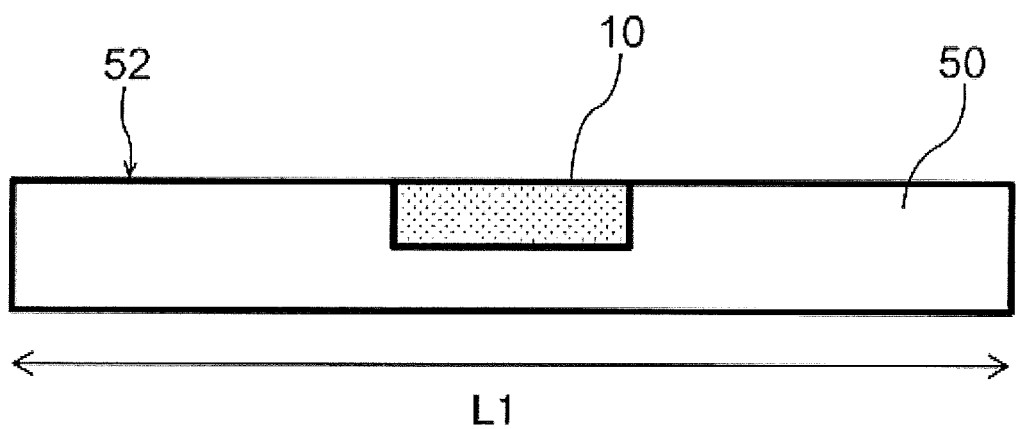
FIG. 2 is a schematic side view that illustrates a state where a urethane foam is stretched in the evaluations of the waveform shape and the repeated reproducibility in Example 1.
Figure 3:
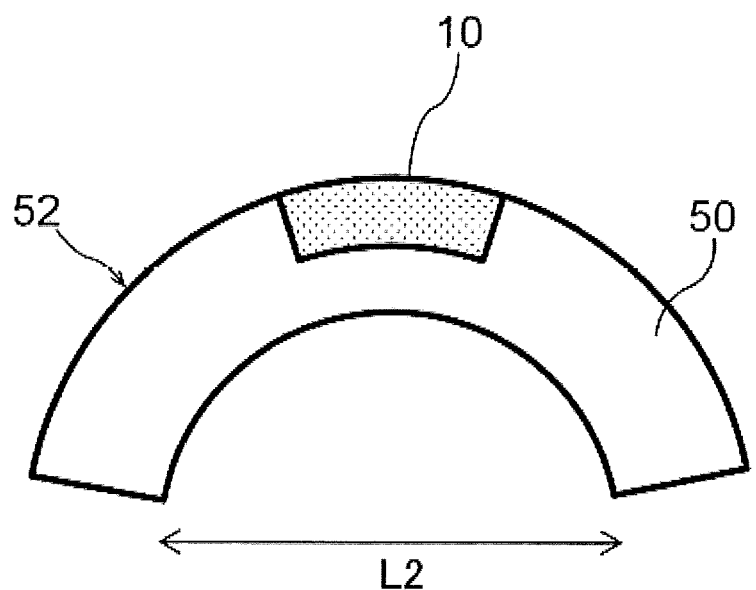
FIG. 3 is a schematic side view that illustrates a state where the urethane foam is bend-deformed in the evaluations of the waveform shape and the repeated reproducibility in Example 1.

FIG. 2 is a schematic side view that illustrates a state where the urethane foam is stretched in the evaluations of the waveform shape and the repeated reproducibility, and FIG. 3 is a schematic side view that illustrates a state where the urethane foam is bend-deformed in the evaluations of the waveform shape and the repeated reproducibility.

First, as illustrated in FIG. 2, a urethane foam 50 having a semi-circular cross-section of 30 mm in radius and a length (L1) of 400 mm was prepared.

On the central part of a curved surface 52 of the urethane foam 50, the extraction electrode-equipped fabric 10 was arranged in a direction in which the long side of the evaluation area of the extraction electrode-equipped fabric 10 was aligned with the lengthwise direction of the urethane foam. In this state, the extraction electrode-equipped fabric 10 was immobilized on the urethane foam 50 using a supporter (not illustrated).

Next, the extraction electrodes (the front surface-side extraction electrode and the back surface-side extraction electrode) of the extraction electrode-equipped fabric 10 were connected to a digital oscilloscope (TBS1052B, manufactured by Tektronix, Inc.).

In this state, the urethane foam 50 was deformed (bend-stretch deformation) 10 times. In this process, a single deformation consisted of actions of bend-deforming the urethane foam 50 over a period of 0.25 seconds in the direction of applying a tensile force to the extraction electrode-equipped fabric (see FIG. 3) and subsequently straightening out the urethane foam 50 (restoring the original shape; see FIG. 2) over a period of 0.25 seconds. In the bend-deformation, the urethane foam 50 was bend-deformed until a linear distance from one end to the other end of the urethane foam 50 (length L2 in FIG. 3) of 330 mm was achieved.

Hereinafter, the time required for a single bend-stretch deformation (0.5 seconds) is referred to as "single deformation cycle".

During the period of performing the bend-stretch deformation 10 times, the waveform output to the oscilloscope was observed, and the waveform shape and the repeated reproducibility were each evaluated based on the following criteria.

—Criteria for Evaluating Waveform Shape—

A: In the waveform shape of a single deformation cycle, no signal smaller and sharper than the deformation cycle was generated (see the waveform shape of Example 1 shown in FIG. 7).

B: In the waveform shape of a single deformation cycle, hardly any signal smaller and sharper than the deformation cycle was generated.

C: In the waveform shape of a single deformation cycle, signals smaller and sharper than the deformation cycle were generated.

D: In the waveform shape of a single deformation cycle, a large number of signals smaller and sharper than the deformation cycle were generated (see the waveform shape of Comparative Example 1 shown in FIG. 8).

(Among A to D, A represents the highest sensor sensitivity.)

—Criteria for Evaluating Repeated Reproducibility—

A: The R % calculated by the following equation was 30% or lower.

B: The R % calculated by the following equation was higher than 30% but not higher than 100%.

C: The R % calculated by the following equation was higher than 100%.

(Among A to C, A represents the highest repetition stability of sensor sensitivity.)

$$R\ \% = 100 \times |PP\text{max} - PP\text{min}|/PP\text{ave}$$

PP: Difference between the maximum and minimum values of the voltage generated during a single deformation cycle PPmax: Maximum PP value in 10 deformation cycles
PPmin: Minimum PP value in 10 deformation cycles
PPave: Average PP value in 10 deformation cycles (Evaluation of Linearity)

The linearity of the sensor sensitivity with respect to the bend-deformation amount of the fabric was evaluated as follows.

A high linearity indicates that the fabric is capable of maintaining excellent sensor sensitivity even in those places where the bend-deformation amount is large and a calculation of the deformation amount from the output has a small error.

First, the operations up to the point of connecting the extraction electrodes (the front surface-side extraction electrode and the back surface-side extraction electrode) of the extraction electrode-equipped fabric immobilized on the urethane foam to the digital oscilloscope were performed in the same manner as in the above-described evaluations of the waveform shape and the repeated reproducibility.

Then, in accordance with the evaluations of the waveform shape and the repeated reproducibility, the urethane foam was deformed (bend-stretch deformation) 3 times.

It is noted here however that, in the evaluation of the linearity, the length L2 (see FIG. 3) was set at 370 mm in the first deformation; the length L2 (see FIG. 3) was set at 330 mm in the second deformation; and the length L2 (see FIG. 3) was set at 280 mm in the third deformation. That is, in the evaluation of the linearity, the bend-deformation amount was increased for each deformation cycle.

During the period of performing the bend-stretch deformation 3 times, the waveform output to the oscilloscope was observed, and the linearity was evaluated based on the following criteria.

—Criteria for Evaluating Linearity—
A: The below-described r value was 0.9 or larger.
B: The below-described r value was from 0.8 to less than 0.9.
C: The below-described r value was less than 0.8.

(Among A to C, A represents the highest linearity of the sensor sensitivity with respect to the bend-deformation amount.)

r value: a correlation coefficient obtained by determining the below-described ΔL and PP in each of the three deformation cycles and then plotting the results of the three deformation cycles with the ΔL and the PP being indicated on the abscissa and the ordinate, respectively.

PP: Difference between the maximum and minimum values of the voltage generated during a single deformation cycle ΔL: Length L1−Length L2

(Evaluation of Durability)

The durability of the fabric against bend-deformation was evaluated as follows.

First, in the same manner as in the above-described evaluations of the waveform shape and the repeated reproducibility, the extraction electrode-equipped fabric (hereinafter, also referred to as "sample") was immobilized on the urethane foam using a supporter.

In this state, the same bend-stretch deformation as described in the evaluations of the waveform shape and the repeated reproducibility was performed 100 times.

After performing the bend-stretch deformation 100 times, the outer appearance of the sample was observed, and the durability against bend-deformation was evaluated based on the following evaluation criteria.

—Criteria for Evaluating Durability—
A: Neither breakage nor wrinkling occurred on the sample.
B: Breakage and/or wrinkling occurred partially on the sample.
C: Breakage and/or wrinkling occurred on the entire surface of the sample.

(Among A to C, A represents the highest durability.)

Example 2

The same operations as in Example 1 were performed, except that the 3 mm-wide piezoelectric body was not used as a weft yarn.

That is, in Example 2, an evaluation sample was prepared without using a member corresponding to a weft yarn, and the thus obtained evaluation sample was evaluated.

The results thereof are shown in Table 1.

Figure 4:
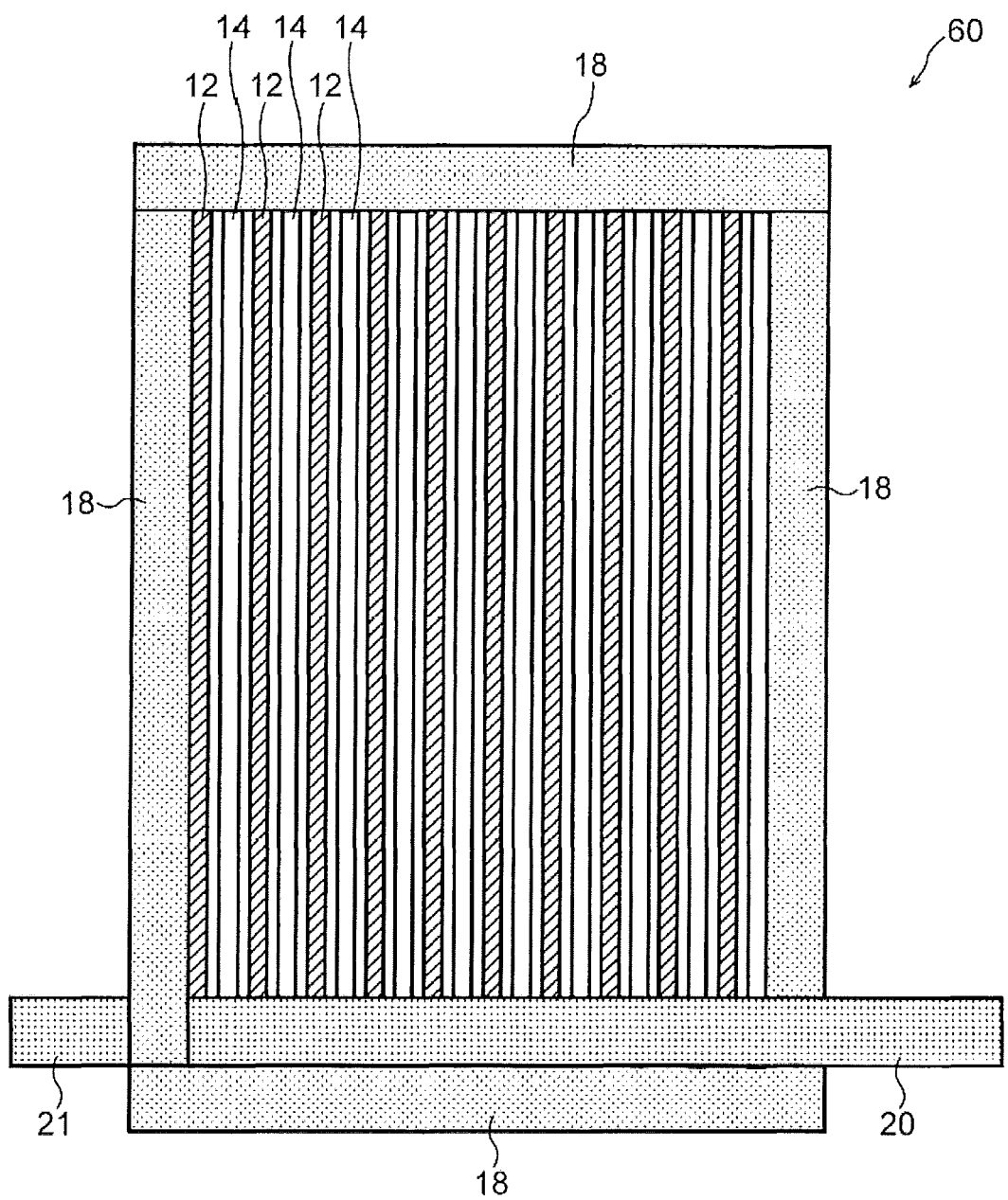
FIG. 4 is a schematic plan view that conceptually illustrates an evaluation sample of Example 2.

FIG. 4 is a schematic plan view that conceptually illustrates an evaluation sample 60 in Example 2.

As illustrated in FIG. 4, the evaluation sample 60 had the same constitution as the extraction electrode-equipped fabric 10 of Example 1, except that the evaluation sample 60 did not include the 3 mm-wide piezoelectric body 16 as a weft yarn.

Examples 3 to 5, 7 and 8

The same operations as in Example 1 were performed, except that the widths of the layered body and piezoelectric body (both were 3 mm) used for the formation of a fabric were changed as shown in Table 1 (i.e., the layered body and the piezoelectric body both had a length of 200 mm as in Example 1).

The results thereof are shown in Table 1.

The 6 mm-wide piezoelectric body used in Example 3 had a birefringence of 0.0215; the 15 mm-wide piezoelectric body used in Example 4 had a birefringence of 0.0215; the 30 mm-wide piezoelectric body used in Example 5 had a birefringence of 0.0213; the 2 mm-wide piezoelectric body used in Example 7 had a birefringence of 0.0215; and the 1 mm-wide piezoelectric body used in Example 8 had a birefringence of 0.0215.

Example 6

The same operations as in Example 3 were performed, except that all of the layered bodies used in Example 3 for the production of a fabric (layered bodies having a layered structure of electrode layer/piezoelectric body/electrode layer, which were used as warp yarns) were changed to layered bodies having an inverted region area ratio of 50%.

The "inverted region area ratio" indicates the area ratio (%) of an inverted region with respect to each layered body when viewed from one of the main surfaces of the fabric.

The result thereof is shown in Table 1.

In Example 6, the layered bodies having an inverted region area ratio of 50% were prepared by twisting and inverting the layered bodies of Example 3 at the lengthwise central part around the lengthwise direction.

Figure 5:
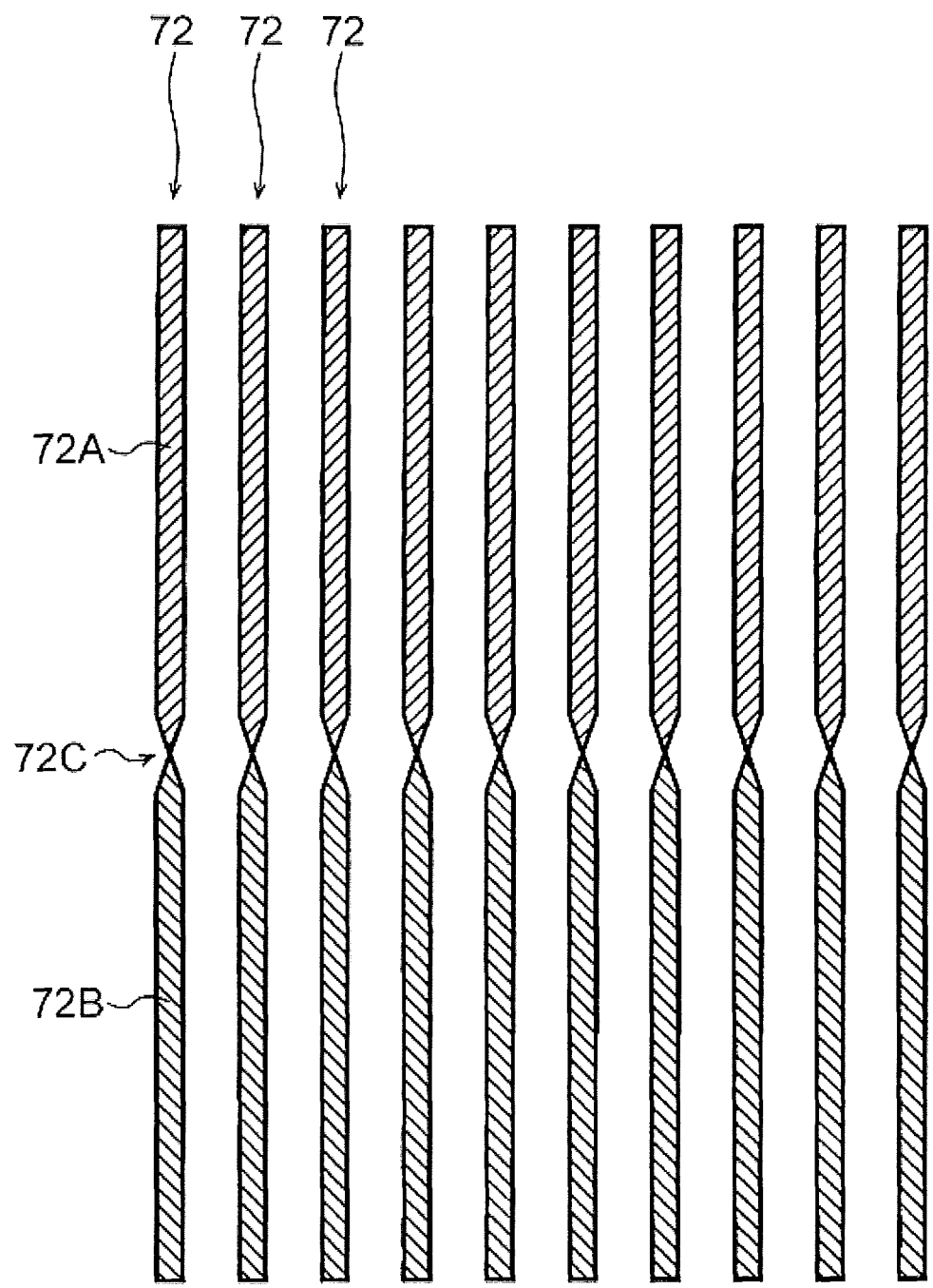
FIG. 5 is a schematic plan view that conceptually illustrates layered bodies (10 layered bodies) having an inverted region area ratio of 50%, which view is taken from the side corresponding to the front surface side of a fabric.

FIG. 5 is a schematic plan view that conceptually illustrates the layered bodies used in Example 6 (10 layered bodies) which had an inverted region area ratio of 50%. FIG. 5 is a schematic plan view taken from the side corresponding to the front surface side of the fabric.

As illustrated in FIG. 5, in each layered body 72 having an inverted region area ratio of 50%, with its center being a twisted part 72C in the lengthwise central part, a non-inverted region 72A and an inverted region 72B exist at a ratio (area of non-inverted region 72A:area of inverted region 72B) of 50%:50%.

Comparative Example 1

The same operations as in Example 1 were performed except that, in the "Production of Evaluation Sample (Extraction Electrode-equipped Fabric)", the "fabric" was changed to the "layered film" (layered film having a layered structure of Al electrode layer/piezoelectric film/Al electrode layer) used in the same Example 1.

That is, in Comparative Example 1, not a fabric but a layered film was prepared as an evaluation sample, and the evaluations were performed on this evaluation sample. In this process, the evaluation sample was prepared such that its long-side direction was the stretching direction (MD) of the piezoelectric film.

The results thereof are shown in Table 1.

Figure 6:
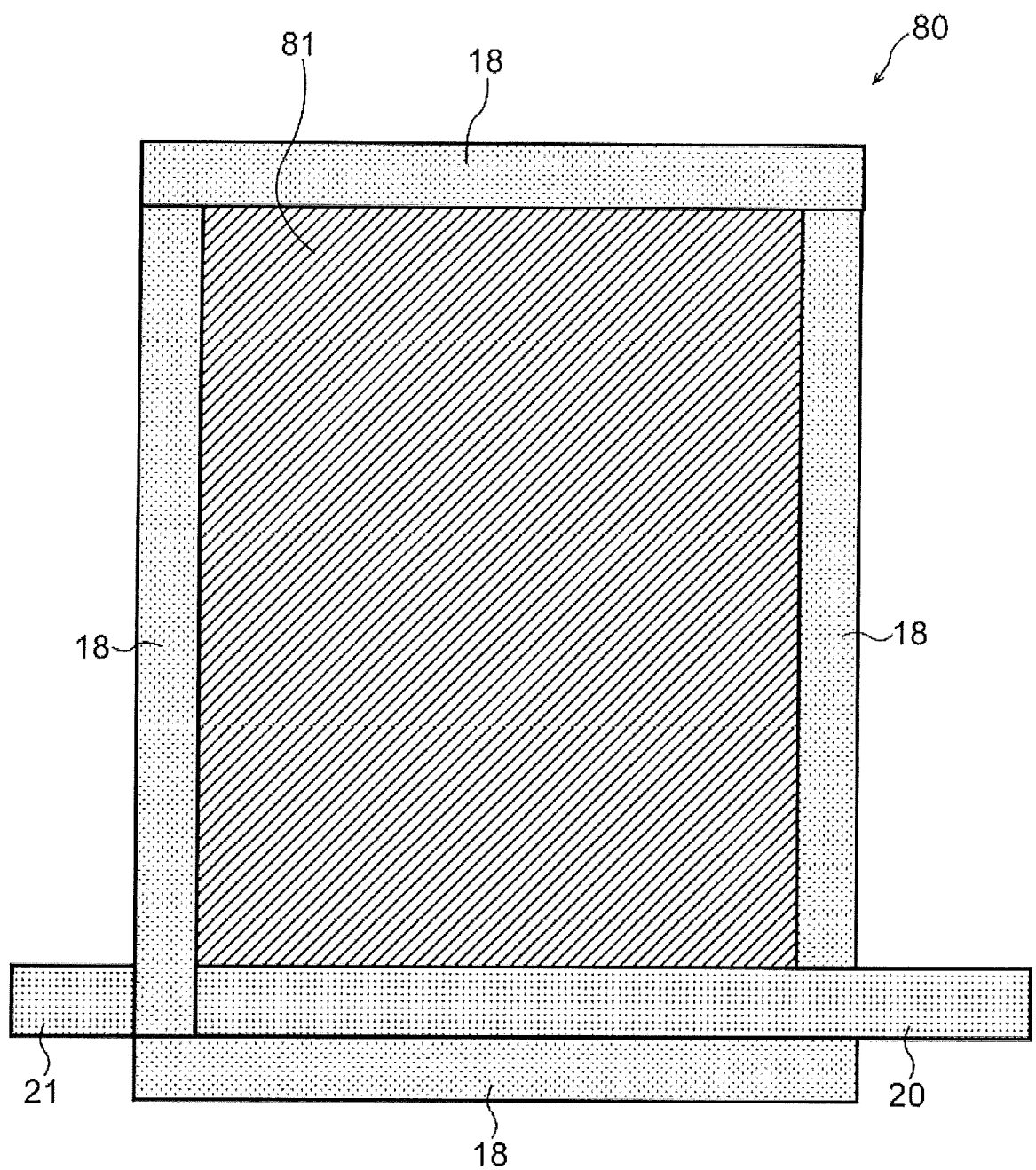
FIG. 6 is a schematic plan view that conceptually illustrates an evaluation sample of Comparative Example 1.

FIG. 6 is a schematic plan view that conceptually illustrates the evaluation sample of Comparative Example 1.

As illustrated in FIG. 6, an evaluation sample 80 of Comparative Example 1 had the same constitution as the extraction electrode-equipped fabric 10 of Example 1, except that the fabric composed of warp yarns and weft yarns was changed to a layered film 81.

Figure 7:
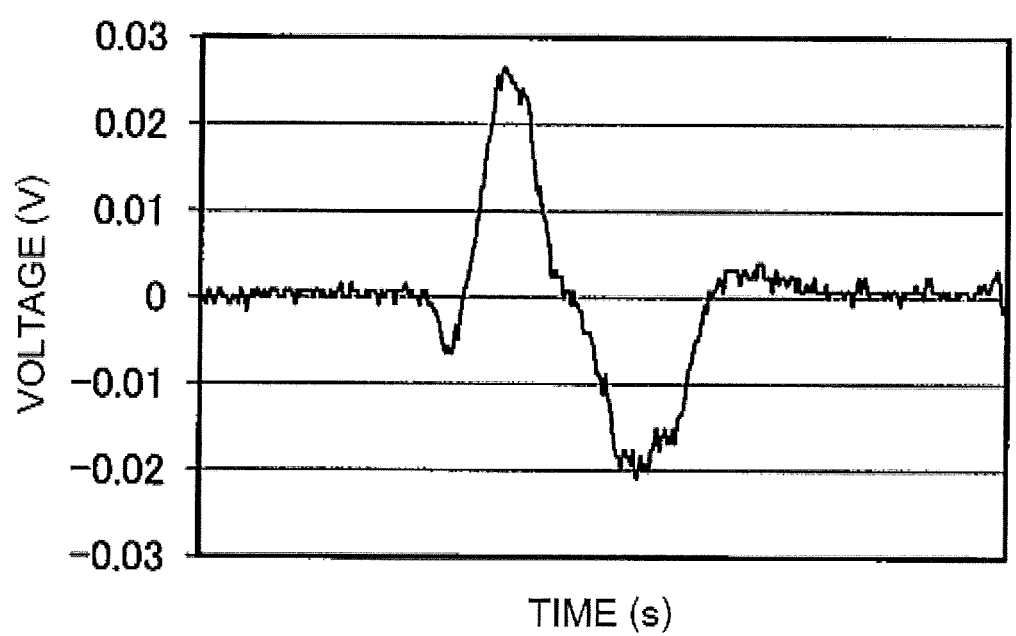
FIG. 7 is a graph showing the waveform shape in a single deformation cycle performed in Example 1.

As shown in FIG. 7, in the waveform shape during a single deformation cycle performed in Example 1, no signal smaller and sharper than the deformation cycle was generated. This result means that the evaluation sample had excellent sensor sensitivity for bend-deformation.

Figure 8:
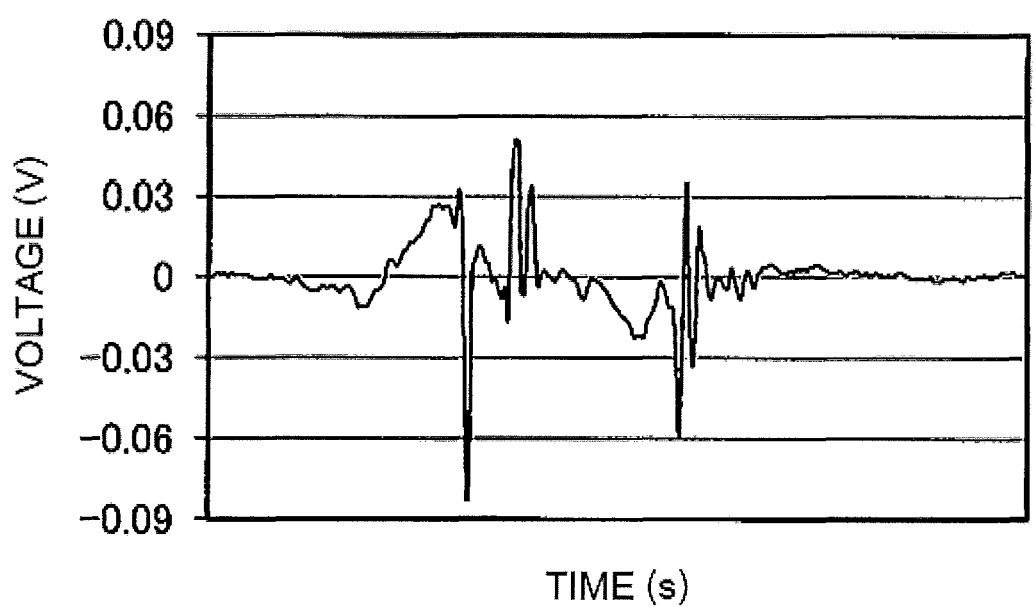
FIG. 8 is a graph showing the waveform shape in a single deformation cycle performed in Comparative Example 1.

On the other hand, as shown in FIG. 8, a large number of signals smaller and sharper than the deformation cycle were generated in the waveform shape during a single deformation cycle performed in Comparative Example 1. Such small and sharp signals make signal processing difficult, as a result of which the sensor sensitivity is reduced.

It is noted here that, in the above-described Examples, the evaluation samples were prepared using elongated plate-form layered bodies (electrode-equipped piezoelectric bodies) and elongated plate-form piezoelectric bodies (piezoelectric bodies with no electrode); however, only the elongated plate-form layered bodies (electrode-equipped piezoelectric bodies) contribute to the piezoelectric properties. Therefore, the piezoelectric bodies with no electrode are arbitrary members in Examples, and it is needless to say that the same results as those of Examples should be obtained even if the piezoelectric bodies with no electrode are changed to polymer members other than piezoelectric bodies, such as yarns or fibers.

Example 9

(Measurement of Respiration and Heartbeat)

As Example 9, the respiration and the heartbeat of a test subject were measured using the evaluation sample (extraction electrode-equipped fabric) of Example 1 as a biological information acquisition device. The details thereof are as follows.

TABLE 1

| | | Evaluation samples | | | | | |
|---|---|---|---|---|---|---|---|
| | | Width of layered body and piezoelectric body (mm) | Inverted region area ratio of layered body (%) | Evaluation results | | | |
| | Structure | | | Waveform shape | Repeated reproducibility | Linearity | Durability |
| Example 1 | fabric | 3 | 0 | A | A | A | A |
| Example 2 | only warp yarns | 3 | 0 | A | A | A | A |
| Example 3 | fabric | 6 | 0 | A | A | A | A |
| Example 4 | fabric | 15 | 0 | A | B | A | A |
| Example 5 | fabric | 30 | 0 | C | B | B | B |
| Example 6 | fabric | 6 | 50 | B | A | C | A |
| Example 7 | fabric | 2 | 0 | A | A | A | A |
| Example 8 | fabric | 1 | 0 | A | A | A | A |
| Comparative Example 1 | film | — | 0 | D | C | C | C |

As shown in Table 1, the evaluation samples of Examples 1 to 8 in which an elongated plate-form piezoelectric body was used had superior waveform shape (i.e., sensor sensitivity), superior repeated reproducibility (i.e., stability in sensor sensitivity), superior linearity (i.e., sensor sensitivity at a large deformation amount) and superior durability, as compared to the evaluation sample of Comparative Example 1 in which a film-form piezoelectric body was used.

FIG. 7 is a graph showing the waveform shape in a single deformation cycle performed in Example 1, and FIG. 8 is a graph showing the waveform shape in a single deformation cycle performed in Comparative Example 1.

The evaluation sample (extraction electrode-equipped fabric) was placed on a chair, and the test subject (subject whose respiration and heartbeat were to be measured) sat on the evaluation sample.

In this state, biological signals of the test subject were extracted via the extraction electrode of the evaluation sample, and the thus extracted biological signals were amplified by 10 times using an operational amplifier. The thus amplified signals were passed through a CR filter having a cut-off frequency of 50 Hz, and the signals passing through the CR filter were input to a personal computer (PC) via an AD converter (NI USB-6210, manufactured by National Instruments Corp.).

Figure 9:
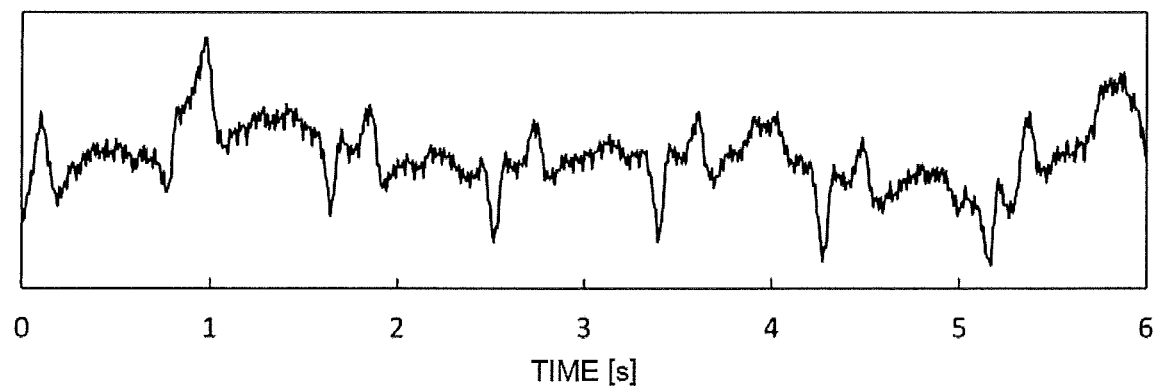
FIG. 9 is a graph showing signals (change in electrical potential over time; composite wave) that were extracted from a test subject and subjected to prescribed processing in Example 9.

The signals that were input to the PC are shown in FIG. 9.

FIG. 9 is a graph showing the signals that were input to the PC (change in electrical potential over time; a composite wave of respiration signals and pulse signals).

Figure 10:
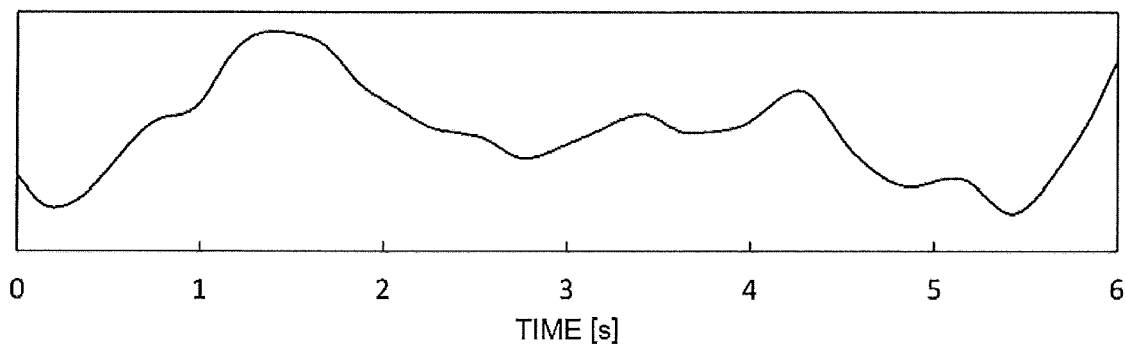
FIG. 10 is a graph showing the respiration signals separated from the composite wave of FIG. 9 in Example 9.
Figure 11:
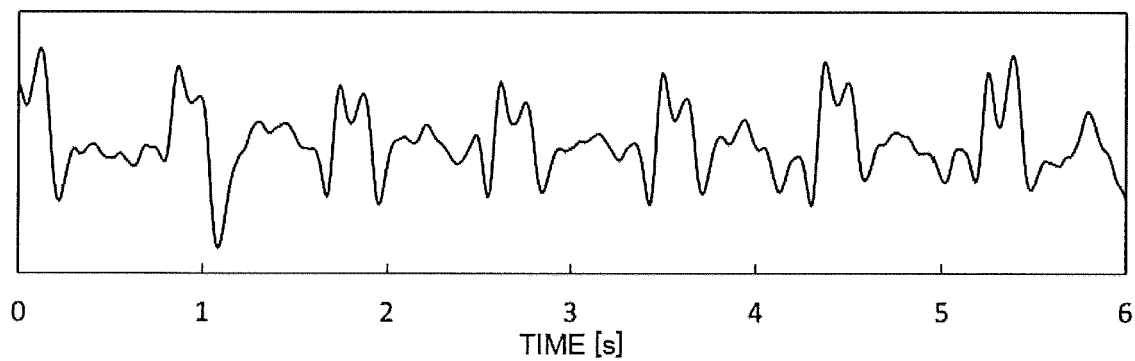
FIG. 11 is a graph showing the pulse signals separated from the composite wave of FIG. 9 in Example 9.
Figure 12:
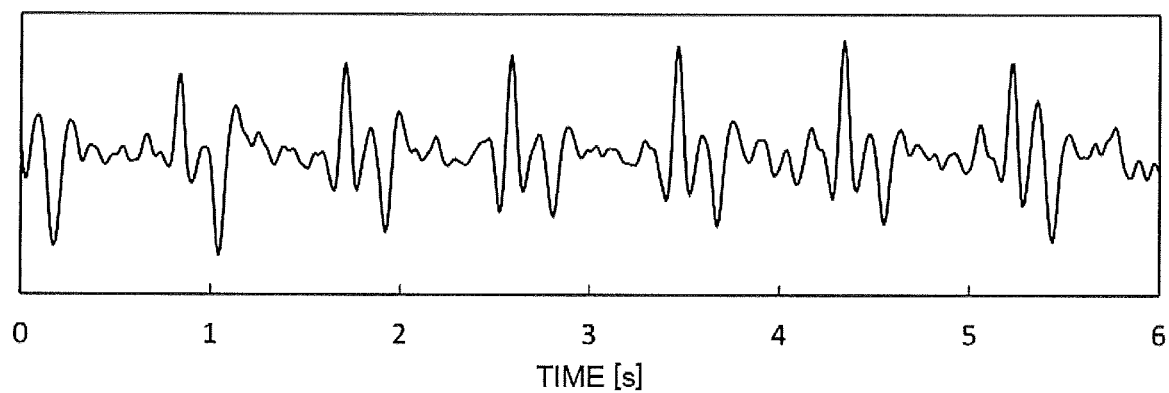
FIG. 12 is a graph showing the velocity pulse wave signals generated from the pulse signals of FIG. 11 in Example 9.

In FIG. 9, the abscissa represents the time (seconds), and the ordinate represents the electrical potential (the same also applies to FIGS. 10 to 12).

Based on the signals that were input to the PC (FIG. 9), separated signals of less than 1 Hz and separated signals of from 1 Hz to 10 Hz were obtained by fast Fourier transformation.

The separated signals of less than 1 Hz were subjected to inverse Fourier transformation to obtain respiration signals corresponding to respiration (FIG. 10).

Meanwhile, the separated signals of from 1 Hz to 10 Hz were subjected to inverse Fourier transformation to obtain pulse signals corresponding to heartbeat (FIG. 11).

As shown in FIGS. 10 and 11, the biological signals (composite wave) generated by the test subject could be separated into the respiration signals (FIG. 10) and the pulse signals (FIG. 11).

Further, velocity pulse wave signals (FIG. 12) were obtained by differentiation of the pulse signals (FIG. 11).

Example 10

Figure 13:
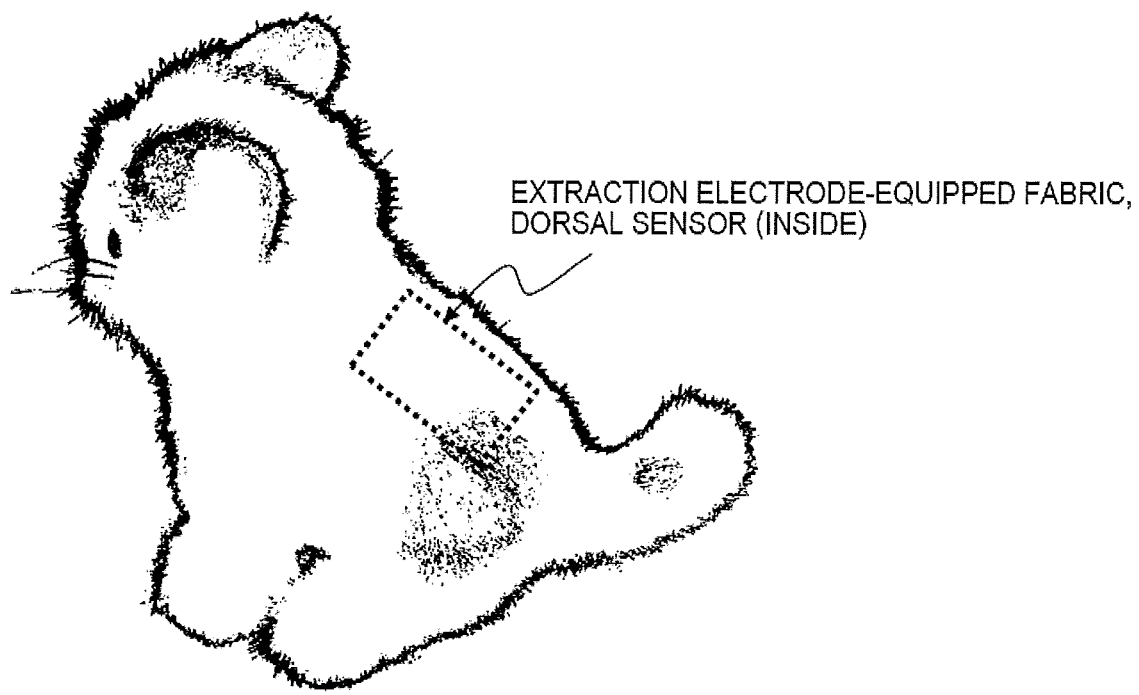
FIG. 13 is a drawing that illustrates a stuffed cat toy installed with a dorsal sensor in Example 10.

Cotton was taken out of a stuffed cat toy, and a 75 mm (long side)×55 mm (short side) extraction electrode-equipped fabric prepared in the same manner as in Example 1 was immobilized inside a dorsal part of the stuffed cat toy with an adhesive (CEMEDINE SUPER X, manufactured by Cemedine Co., Ltd.) and used as a dorsal sensor (contact sensor). A connecting lead wire was attached to each of the front surface-side extraction electrode and the back surface-side extraction electrode of the extraction electrode-equipped fabric and, after installing the sensor, the removed cotton was put back into the stuffed cat toy. FIG. 13 illustrates the stuffed cat toy installed with the dorsal sensor.

Outputs from the lead wire attached to the dorsal sensor were passed through a CR filter having a cut-off frequency of 50 Hz via a buffer amplifier, and signals passing through the CR filter were input to a personal computer (PC) via an AD converter (NI USB-6210, manufactured by National Instruments Corp.).

Figure 14:
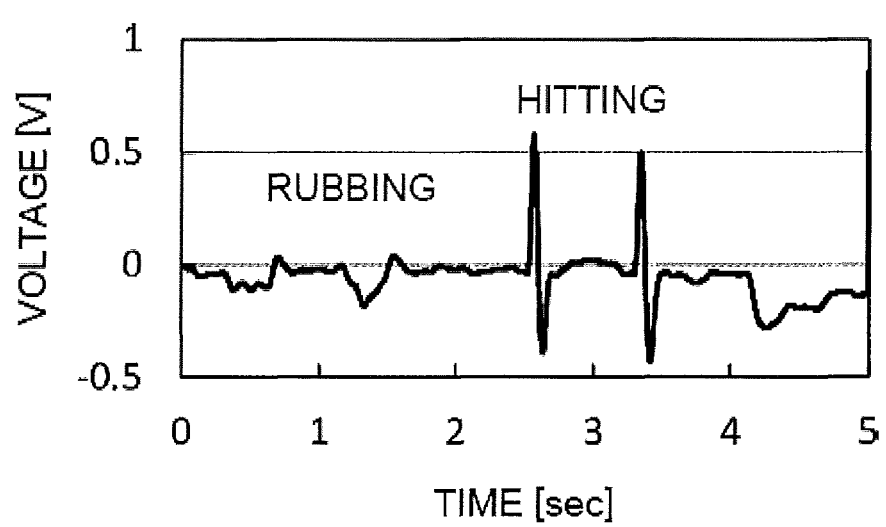
FIG. 14 is a graph showing the voltage outputs obtained by rubbing and hitting the back of the stuffed cat toy installed with the dorsal sensor in Example 10.

The signals that were input to the PC are shown in FIG. 14. As shown in FIG. 14, the voltage outputs are largely different between a case of rubbing the back of the stuffed toy and a case of hitting the back of the stuffed toy, and the dorsal sensor is made capable of determining the actions of rubbing, hitting and the like by setting a voltage threshold value.

The disclosures of Japanese Patent Application No. 2015-198559 filed on Oct. 6, 2015, Japanese Patent Application No. 2016-015263 filed on Jan. 29, 2016, and Japanese Patent Application No. 2016-085422 filed on Apr. 21, 2016, are hereby incorporated by reference in their entirety.

All the documents, patent applications and technical standards that are described in the present specification are hereby incorporated by reference to the same extent as if each individual document, patent application or technical standard is concretely and individually described to be incorporated by reference.

The invention claimed is:

1. An elongated plate-form piezoelectric body, which comprises an optically active helical chiral polymer (A) having a weight-average molecular weight of from 50,000 to 1,000,000 and has an elongated plate shape having a thickness of from 0.001 mm to 0.2 mm, a width of from 0.1 mm to 30 mm and a width-to-thickness ratio of 2 or higher, wherein:
   a lengthwise direction and a main orientation direction of the helical chiral polymer (A) are substantially parallel to each other,
   a crystallinity measured by a DSC method is from 20% to 80%,
   a birefringence is from 0.01 to 0.03, and
   a length-to-width ratio is 20 or higher.

2. The elongated plate-form piezoelectric body according to claim 1, wherein the width is from 0.5 mm to 15 mm.

3. The elongated plate-form piezoelectric body according to claim 1, wherein the helical chiral polymer (A) is a polylactic acid polymer that has a main chain comprising a repeating unit represented by the following Formula (1):

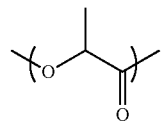

(1)

4. The elongated plate-form piezoelectric body according to claim 1, wherein the helical chiral polymer (A) has an optical purity of not less than 95.00% ee.

5. The elongated plate-form piezoelectric body according to claim 1, wherein a content of the helical chiral polymer (A) is not less than 80% by mass.

6. The elongated plate-form piezoelectric body according to claim 1, which comprises a stabilizer (B) in an amount of from 0.01 parts by mass to 10 parts by mass with respect to 100 parts by mass of the helical chiral polymer (A), the stabilizer (B) comprising at least one functional group selected from the group consisting of a carbodiimide group, an epoxy group and an isocyanate group, and having a weight-average molecular weight of from 200 to 60,000.

7. A layered body comprising:
   the elongated plate-form piezoelectric body according to claim 1; and
   a functional layer arranged on a side of at least one main surface of the elongated plate-form piezoelectric body.

8. The layered body according to claim 7, wherein the functional layer comprises at least one of an adhesion promoting layer, a hard coat layer, an antistatic layer, an anti-block layer, a protective layer, or an electrode layer.

9. The layered body according to claim 7, wherein the functional layer comprises an electrode layer.

10. The layered body according to claim 9, wherein at least one surface layer is the electrode layer.

11. A fabric having a woven structure comprising the layered body according to claim 9.

12. The fabric according to claim 11, wherein, when viewed from one surface side thereof, the layered body does not include any inverted region, or includes an inverted region whose area accounts for 25% or less of the layered body.

13. A fabric having a woven structure comprising:
   plural first elongated members that are aligned in a single direction; and plural second elongated members that are aligned in a direction intersecting with the alignment direction of the plural first elongated members in a plane view, wherein at least one of either the plural first elongated members or the plural second elongated members is the layered body according to claim 9.

14. A fabric having a woven structure comprising:

plural warp yarns that are aligned in a single direction; and plural weft yarns that are aligned in a direction intersecting with the alignment direction of the plural warp yarns in a plane view, wherein:

at least one of the plural warp yarns or at least one of the plural weft yarns comprises the elongated plate-form piezoelectric body according to claim 1, and a width (a) of the elongated plate-form piezoelectric body and an offset distance (b) of the warp yarns or the weft yarns that are arranged substantially parallel to the elongated plate-form piezoelectric body satisfy the following Formula (I):

0.1<b/a<4.0 (I).

15. The fabric according to claim 14, wherein at least one of the plural warp yarns or at least one of the plural weft yarns is a layered body that comprises a functional layer arranged on a side of at least one main surface of the elongated plate-form piezoelectric body.

16. The fabric according to claim 15, wherein the functional layer is an electrode layer.

17. A method of producing the elongated plate-form piezoelectric body according to claim 1, the method comprising:

preparing a piezoelectric film which comprises an optically active helical chiral polymer (A) having a weight-average molecular weight of from 50,000 to 1,000,000, and in which a crystallinity determined by a DSC method is from 20% to 80% and a product of a standardized molecular orientation (MORc) measured using a microwave transmission-type molecular orientation meter at a reference thickness of 50 μm and the crystallinity is from 25 to 700; and slitting the piezoelectric film to obtain the elongated plate-form piezoelectric body.

18. A method of producing the layered body according to claim 1, the method comprising:

preparing a layered film comprising: a piezoelectric film which comprises an optically active helical chiral polymer (A) having a weight-average molecular weight of from 50,000 to 1,000,000, and in which a crystallinity determined by a DSC method is from 20% to 80% and a product of a standardized molecular orientation (MORc) measured using a microwave transmission-type molecular orientation meter at a reference thickness of 50 μm and the crystallinity is from 25 to 700; and a functional layer arranged on a side of at least one main surface of the piezoelectric film; and slitting the layered film to obtain the layered body.

19. A garment comprising the elongated plate-form piezoelectric body according to claim 1.

20. The garment according to claim 18, further comprising a fiber structure.

21. The garment according to claim 18, which is a bottom, a top, a pair of socks, a supporter, or a glove.

22. A biological information acquisition device comprising the elongated plate-form piezoelectric body according to claim 1.

23. A biological information acquisition device comprising the layered body according to claim 7.

24. A biological information acquisition device comprising the fabric according to claim 11.

* * * * *